(12) United States Patent
Viviani

(10) Patent No.: US 9,947,400 B2
(45) Date of Patent: Apr. 17, 2018

(54) METHODS FOR ENHANCED STATE RETENTION WITHIN A RESISTIVE CHANGE CELL

(71) Applicant: Nantero, Inc., Woburn, MA (US)

(72) Inventor: Darlene Viviani, White Salmon, WA (US)

( * ) Notice: Subject to any disclaimer, the term of this patent is extended or adjusted under 35 U.S.C. 154(b) by 0 days.

(21) Appl. No.: 15/136,414

(22) Filed: Apr. 22, 2016

(65) Prior Publication Data
US 2017/0309334 A1    Oct. 26, 2017

(51) Int. Cl.
*G11C 13/00* (2006.01)

(52) U.S. Cl.
CPC ...... *G11C 13/0069* (2013.01); *G11C 13/0002* (2013.01); *G11C 13/0004* (2013.01); *G11C 13/004* (2013.01)

(58) Field of Classification Search
CPC ............ G11C 13/0069; G11C 13/0002; G11C 13/0004; G11C 13/004
See application file for complete search history.

(56) References Cited

U.S. PATENT DOCUMENTS

| | | | |
|---|---|---|---|
| 6,422,450 B1 | 7/2002 | Zhou et al. | |
| 6,423,583 B1 | 7/2002 | Avouris et al. | |
| 6,528,020 B1 | 3/2003 | Dai et al. | |
| 6,706,402 B2 | 3/2004 | Rueckes et al. | |
| 6,808,746 B1 | 10/2004 | Dai et al. | |
| 6,835,591 B2 | 12/2004 | Rueckes et al. | |
| 6,888,773 B2 | 5/2005 | Morimoto | |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark et al. | |
| 6,918,284 B2 | 7/2005 | Snow et al. | |
| 6,919,740 B2 | 7/2005 | Snider et al. | |
| 6,921,575 B2 | 7/2005 | Horiuchi et al. | |
| 7,015,500 B2 | 3/2006 | Choi et al. | |
| 7,115,901 B2 | 10/2006 | Bertin et al. | |
| 7,161,403 B2 | 1/2007 | Bertin et al. | |
| 7,335,395 B2 | 2/2008 | Ward et al. | |
| 7,365,632 B2 | 4/2008 | Bertin et al. | |
| 7,667,999 B2 | 2/2010 | Herner | |
| 7,781,862 B2 | 8/2010 | Bertin et al. | |
| 7,835,170 B2 | 11/2010 | Bertin et al. | |

(Continued)

OTHER PUBLICATIONS

Amblard, G., "Development and characterization of carbon nanotube processes for NRAM technology," Proc. of SPIE 2011, vol. 7970, pp. 797017-1-797017-7.

(Continued)

*Primary Examiner* — Tri Hoang
(74) *Attorney, Agent, or Firm* — Nantero, Inc.

(57) ABSTRACT

A method for improving the stability of a resistive change cell is disclosed. The stability of a resistive change memory cell—that is, the tendency of the resistive change memory cell to retain its programmed resistive state—may, in certain applications, be compromised if the cell is programmed into an unstable or metastable state. In such applications, a programming method using bursts of sub-pulses within a pulse train is used to drive the resistive change cell material into a stable state during the programming operation, reducing resistance drift over time within the cell.

14 Claims, 38 Drawing Sheets

(56) References Cited

U.S. PATENT DOCUMENTS

| | | | |
|---|---|---|---|
| 7,940,547 B2* | 5/2011 | Lee | G11C 13/0007 365/100 |
| 7,982,209 B2 | 7/2011 | Herner | |
| 8,000,127 B2 | 8/2011 | Hamilton et al. | |
| 8,008,745 B2 | 8/2011 | Bertin et al. | |
| 8,018,761 B2* | 9/2011 | Muraoka | G11C 13/00 365/100 |
| 8,102,018 B2 | 1/2012 | Bertin et al. | |
| 8,513,768 B2 | 8/2013 | Bertin et al. | |
| 8,541,843 B2 | 9/2013 | Bertin et al. | |
| 8,619,450 B2 | 12/2013 | Hamilton | |
| 8,659,940 B2 | 2/2014 | Bertin et al. | |
| 9,263,126 B1 | 2/2016 | Viviani | |
| 9,299,430 B1 | 3/2016 | Bertin et al. | |
| 2004/0031975 A1 | 2/2004 | Kern | |
| 2004/0132070 A1 | 7/2004 | Star et al. | |
| 2004/0266106 A1 | 12/2004 | Lee | |
| 2005/0212014 A1 | 9/2005 | Horibe et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates et al. | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2008/0157126 A1 | 7/2008 | Bertin et al. | |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2010/0067290 A1* | 3/2010 | Savransky | G11C 13/0004 365/163 |
| 2016/0322100 A1* | 11/2016 | Tsai | G11C 13/004 |

OTHER PUBLICATIONS

Awano, Y., "Graphene for VLSI: FET and Interconnect Applications," IEDM 2009 Technical Digest, pp. 10.1.1-10.1.4.
Avouris, P., "Carbon Nanotube Electronics," Chemical Physics, 2002, vol. 281, pp. 429-445.
Brock, et al., "Carbon Nanotube Memories and Fabrics in a Radiation Hard Semiconductor Foundry," 2005 IEEE Conference, 9 pgs.
Brown, K. M., "System in package "The Rebirth of SIP"," 2004 IEEE Custom Integrated Circuits, May 2004, 6 pgs.
Collins, et al., "Engineering Carbon Nanotubes and Nanotube Circuits Using Electrical Breakdown," Science, 2001, vol. 292, pp. 706-709.
Crowley, et al., "512 Mb PROM with 8 layers of antifuse/Diode cells," IEEE International Solid-State Circuits Conference, vol. XLVI, Feb. 2003, pp. 284-285.
Cui, J.B., et al., "Carbon Nanotube Memory Devices of High Charge Storage Stability," Applied Physics Letters, Oct. 2002, vol. 81, No. 17, pp. 3260-3262.
Dercke, et al., "Carbon Nanotube Inter—and Intramolecular Logic Gates," Nano Letters, Sep. 2001, vol. 1, No. 9, pp. 453-456.
Fuhrer, M.S., et al., "High-Mobility Nanotube Transistor Memory," Nano Letters, 2002, vol. 2, No. 7, pp. 755-759.
Hone, J., "Phonons and Thermal Properties of Carbon Nanotubes," Topics Appl. Phys., 2001, vol. 80, pp. 273-286.
Huai, Y., "Spin-Transfet Torque MRAM (STT-MTAM): Challenges and Prospects," AAPS Bulletin, vol. 18, No. 6, Dec. 2008, pp. 33-40.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R.C., "IBM fellow unrolls blueprint for nano," EE Times, 3 pgs., Mar. 6, 2006, http://www.eetimes.com/showArticle.ihtml?ArticleID=181500304.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Quantum Interference and Ballistic Transmission in Nanotube Electron Wavegrinders," The American Physical Society,, 2001, vol. 87, No. 10, pp. 106801-1-106801-4.
Onoa, et al., "Bulk Production of Singly Dispersed Carbon Nanotubes with Prescribed Lengths," Nanotechnology, 2005, vol. 16, pp. 2799-2803.
Langer, et al., "Electrical Resistance of a Carbon Nanotube Bundle," J. Mater. Res., 1994, vol. 9, No. 4, pp. 927-932.
Novak, et al., "Nerve Agent Detection Using Networks of Single-Walled Carbon Nanotubes," Applied Physics Letters, Nov. 2003, vol. 83, No. 19, pp. 4026-4028.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, Jul. 2000, vol. 289, pp. 94-97.
Servalli, G., "A 45nm Generation Phase Change Memory Technology," IEDM 2009 Technical Digest, pp. 5.7.1-5.7.4.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," Applied Physics Letters, Mar. 2003, vol. 82, No. 13, pp. 2145-2147.
Star, et al., "Nanoelectronic Carbon Dioxide Sensors,"Adv. Mater. 2004, 16, No. 22, Nov. 18, pp. 2049-2052.
Star, et al., Nanotube Optoelectronic Memory Devices, Nano Letter, 2004, vol. 4, No. 9, pp. 1587-1591.
Ward, et al., "A Non-Volatile Nanoelectromechanical Memory Element Utilizing a Fabric of Carbon Nanotubes," IEEE 2004, pp. 34-38.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.
International Search Report for PCT/US2017/028606, dated Jun. 22, 2017, 3 pages.
Written Opinion for PCT/US2017/028606, dated Jun. 22, 2017, 6 pages.

* cited by examiner

METHODS FOR ENHANCED STATE RETENTION WITHIN A RESISTIVE CHANGE CELL

CROSS-REFERENCE OF RELATED CASES

This application is related to the following U.S. Patents, which are assigned to the assignee of the present application, and are hereby incorporated by reference in their entirety:
  U.S. Pat. No. 6,835,591, filed on Apr. 23, 2002, entitled Methods of Nanotube Films and Articles;
  U.S. Pat. No. 7,335,395, filed on Jan. 13, 2003, entitled Methods of Using Pre Formed Nanotubes to Make Carbon Nanotube Films, Layers, Fabrics, Ribbons, Elements, and Articles;
  U.S. Pat. No. 6,706,402, filed on Mar. 16, 2004, entitled Nanotube Films and Articles;
  U.S. Pat. No. 7,115,901, filed on Jun. 9, 2004, entitled Non-Volatile Electromechanical Field Effect Devices and Circuits Using Same and Methods of Forming Same;
  U.S. Pat. No. 7,365,632, filed on Sep. 20, 2005, entitled Resistive Elements Using Carbon Nanotubes;
  U.S. Pat. No. 7,781,862, filed on Nov. 15, 2005, entitled Two-Terminal Nanotube Devices and Systems and Methods of Making Same;
  U.S. Pat. No. 8,513,768, filed on Aug. 8, 2007, entitled Nonvolatile Nanotube Diodes and Nonvolatile Nanotube Blocks and Systems Using Same and Methods of Making Same;
  U.S. Pat. No. 8,541,843, filed on Aug. 6, 2009, entitled Nonvolatile Nanotube Programmable Logic Devices and a Nonvolatile Nanotube Field Programmable Gate Array Using Same;
  U.S. Pat. No. 8,000,127, filed on Nov. 13, 2009, entitled Method for Resetting a Resistive Change Memory Element;
  U.S. Pat. No. 8,619,450, filed on Sep. 1, 2010, entitled A Method for Adjusting a Resistive Change Element Using a Reference;
  U.S. Pat. No. 9,263,126, filed on Aug. 12, 2014, entitled Method for Dynamically Accessing and Programming Resistive Change Element Arrays; and
  U.S. Pat. No. 9,299,430, filed on Jan. 22, 2015, entitled Methods for Reading and Programming 1-R Resistive Change Element Arrays.

This application is related to the following U.S. Patent Applications, which are assigned to the assignee of the application, and are hereby incorporated by reference in their entirety:
  U.S. patent application Ser. No. 14/812,173, filed on Jul. 29, 2015, entitled DDR Compatible Memory Circuit Architecture for Resistive Change Element Arrays.

BACKGROUND

1. Technical Field

The present disclosure relates generally to resistive change elements, and, more specifically, to a method of programming resistive change elements into stable non-volatile resistive states.

2. Discussion of Related Art

Any discussion of the related art throughout this specification should in no way be considered as an admission that such art is widely known or forms part of the common general knowledge in the field.

Resistive change devices and arrays, often referred to as resistance RAMS by those skilled in the art, are well known in the semiconductor industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual memory cell between two or more resistive states. For example, each resistive state within a resistive change memory cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

Within the current state of the art, there is an increasing need to reliably and rapidly control the switching of resistive change elements as they are adjusted from one resistive state to another.

To this end, it would be advantageous to provide programming methods for resistive change memory cells that ensured that cells responsive to such methods were adjusted into stable non-volatile resistive states.

SUMMARY

The present disclosure relates to methods of adjusting a resistive change element and, more specifically, to a method for adjusting a resistive change element which renders the element into a stable non-volatile resistive state.

In particular, the present disclosure provides a method of adjusting the resistance of a non-volatile resistive change material. The method comprises applying a stimulus to said non-volatile resistive change material. The stimulus is comprised of a plurality of sub-pulses, this plurality of sub-pulses successively stimulating the resistive change material multiple times. This successive stimulation renders the resistive change material into a stable resistive state.

According to one aspect of the present disclosure the successive stimulation prevents the resistive change material from entering into a metastable state.

According to another aspect of the present disclosure the stimulus is an electrical stimulus and the sub-pulses are voltage pulses.

According to another aspect of the present disclosure the resistive change material is a nanotube fabric layer.

According to another aspect of the present disclosure the resistive change material is a metal oxide film.

According to another aspect of the present disclosure the resistive change material is chalcogenide.

According to another aspect of the present disclosure said resistive change material is part of a memory cell.

According to another aspect of the present disclosure said resistive change material is part of a logic device.

According to another aspect of the present disclosure said resistive change material is part of a sensor device.

Other features and advantages of the present disclosure will become apparent from the following description of the invention, which is provided below in relation to the accompanying drawings.

DETAILED DESCRIPTION

Figure 5A:
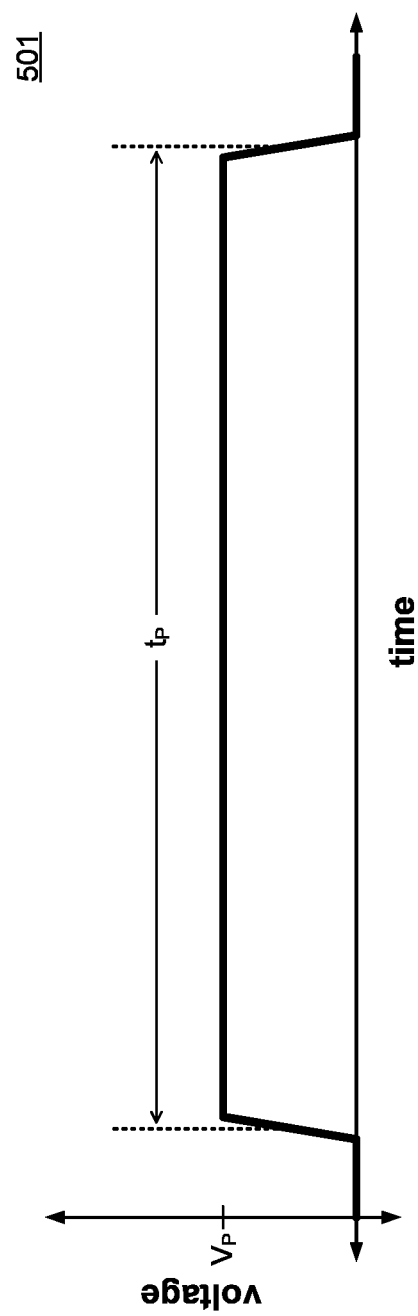
FIG. 5A is a waveform plot depicting an exemplary resistive change cell programming stimulus comprising a single voltage pulse.
Figure 5B:
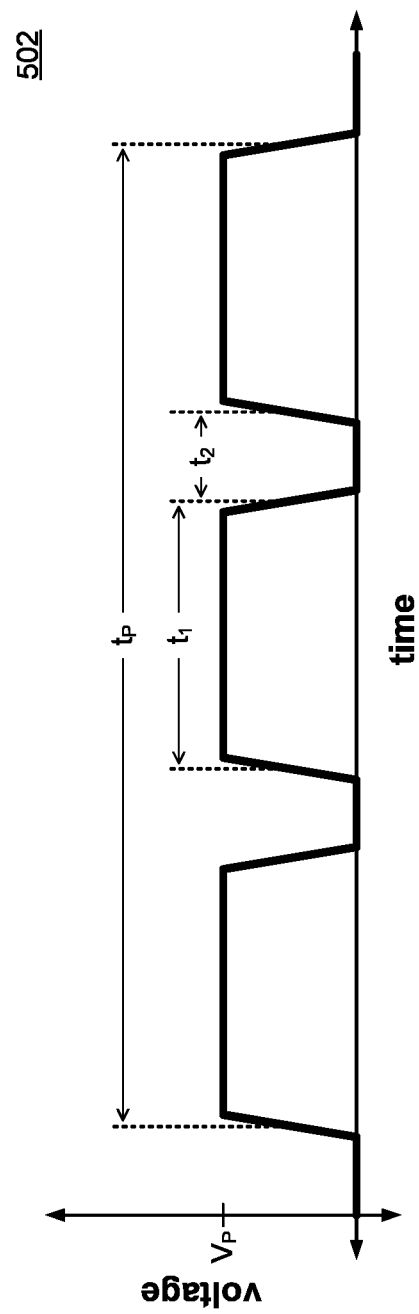
FIG. 5B is a waveform plot depicting an exemplary resistive change cell programming stimulus comprising a short pulse train made up of a plurality of sub-pulses.
Figure 5C:
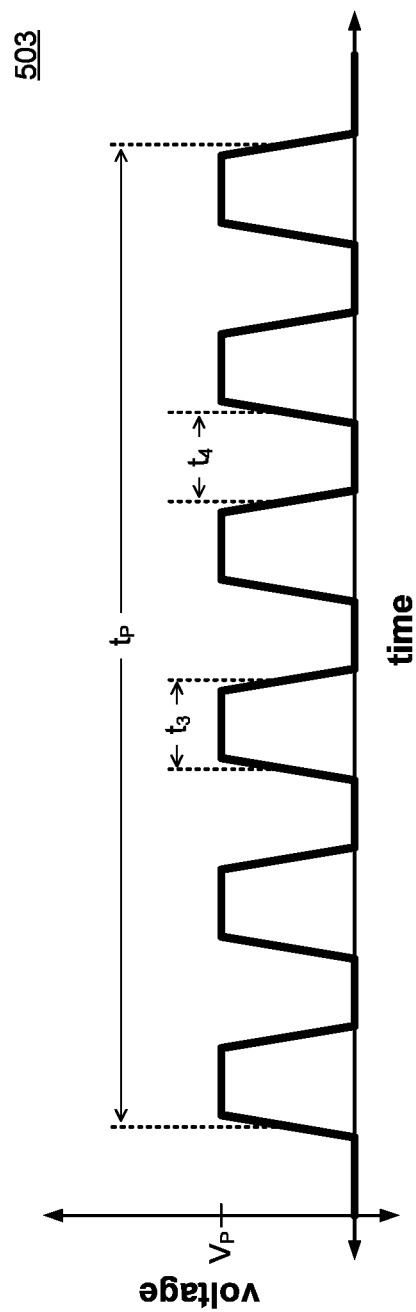
FIG. 5C is a waveform plot depicting an exemplary resistive change cell-programming stimulus comprising a long pulse train made up of a plurality of sub-pulses.

The present disclosure relates to a method of adjusting a resistive change element from one resistive state to another resistive state, such that resistive change element is rendered into a stable state. That is, the programming methods of the present disclosure will adjust resistive change memory cells into stable, non-volatile resistive states, minimizing drift—that is, the tendency for the electrical resistance of the programmed cell to change after programming—within the programmed cells. Specifically, the present disclosure uses pulse trains comprised of bursts of sub-pulses to adjust the resistance of a resistive change element fully into a stable, non-volatile resistive state. As will be demonstrated within the present disclosure, within certain applications the use of a single programming pulse (such as is depicted in FIG. 5A) can render resistive change elements into unstable or metastable state, resulting in drift within programmed elements over time. However, such applications, the use of a pulse train (such as depicted in FIGS. 5B and 5C) to adjust the state of a resistive change memory cell will stimulate the resistive change material with a resistive change memory cell multiple times, significantly reducing the likelihood that the cell will be left in an unstable or metastable state at the end of the programming operation.

Resistive change memory cells store information through the use of a resistive change element within the cell. Responsive to electrical stimulus, this resistive change element can be adjusted between at least two non-volatile resistive states. Typically, two resistive states are used: a low resistive state (corresponding, typically, to a logic '1,' a set state) and a high resistive state (corresponding, typically, to a logic '0,' a reset state). In this way, the resistance value of the resistive change element within the resistive change memory cell can be used to a store a bit of information. According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell.

Resistive change elements can use, for example, two-terminal switches, block switches, phase change memory, or metal oxides, as well as other materials and designs.

Though the present disclosure uses resistive change memory cells as an example, the disclosure is not limited to memory. Indeed, the methods of the present disclosure could be used to adjust the resistance of resistive change elements within logic devices, analog circuitry, sensors, and the like.

Figure 1:
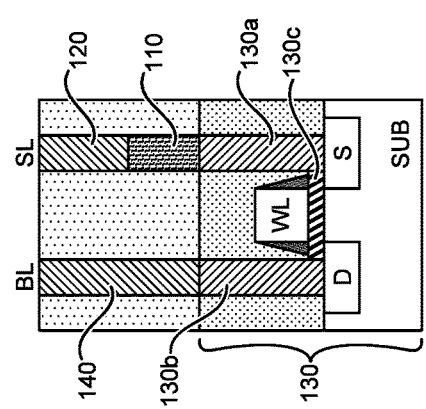
FIG. 1 illustrates an exemplary layout of a vertically oriented resistive change memory cell, according to one aspect of the present disclosure.

FIG. 1 illustrates the layout of an exemplary resistive change memory cell which includes a vertically oriented resistive change element (such a structure is sometimes termed a 3D memory cell by those skilled in the art). A typical FET device 130 is formed within a first device layer, including a drain D, a source S, and a gate structure 130c. The structure and fabrication of such an FET device 130 will be well known to those skilled in the art.

A resistive change element 110 is formed in a second device layer. Conductive structure 130a electrically couples a first end of resistive change element 110 with the source terminal of FET device 130. Conductive structure 120 electrically couples a second end of resistive change element 110 with an external source line SL outside the memory cell. Conductive structures 130b and 140 electrically couple the drain terminal of FET device 130 with an external bit line BL. An external word line WL is electrically coupled to gate structure 130c.

Figure 2:
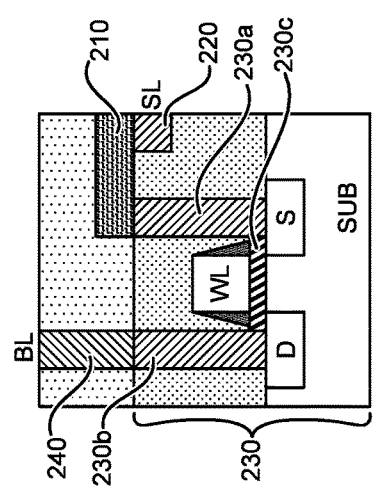
FIG. 2 illustrates an exemplary layout of a horizontally oriented resistive change memory cell, according to one aspect of the invention.

FIG. 2 illustrates the layout of an exemplary resistive change memory cell which includes a horizontally oriented resistive change element (such a structure is sometimes termed a 2D memory cell by those skilled in the art). A typical FET device 230 is formed within a first device layer, including a drain D, a source S, and a gate structure 230c. As with the FET device (130) depicted in FIG. 1, the structure and fabrication of such an FET device 230 will be well known to those skilled in the art.

A resistive change element 210 is formed in a second device layer. Conductive structure 230a electrically couples a first end of resistive change element 210 with the source terminal of FET device 230. Conductive structure 220 electrically couples a second end of resistive change element 210 with an external source line SL outside the memory cell. Conductive structures 230b and 240 electrically couple the drain terminal of FET device 230 with an external bit line BL. An external word line WL is electrically coupled to gate structure 230c.

Within both of the memory cells depicted in FIGS. 1 and 2, the resistive change element is adjusted between different resistive states by applying electrical stimulus between the bit line (BL) and the source line (SL). A voltage is applied to the gate structure (130c in FIG. 1 and 230c in FIG. 2) through the word line (WL) which allows electrical current to flow through the series combination of the FET device (130 in FIG. 1 and 230 in FIG. 2) (which, depending on the gate voltage applied, may act as a current limiting device) and the resistive change element (110 in FIG. 1 and 210 in FIG. 2). By controlling the magnitude and the duration of this electrical current, the resistive change element (110 in FIG. 1 and 210 in FIG. 2) can be adjusted between a plurality of resistive states.

The state of the memory cells depicted in FIGS. 1 and 2 can be determined, for example, by applying a DC test voltage, for example, but not limited to, 0.5V, between the source line (SL) and the bit line (BL) while applying a voltage to gate structure (130c in FIG. 1 and 230c in FIG. 2) sufficient to turn on the FET device (130 in FIG. 1 and 230 in FIG. 2) and measuring the current through the resistive change element (110 in FIG. 1 and 210 in FIG. 2). In some applications this current can be measured by using a power supply with a current feedback output, for example, a programmable power supply or a sense amplifier. In other applications this current can be measured by inserting a current measuring device in series with the resistive change element (110 in FIG. 1 and 210 in FIG. 2).

Alternatively, the state of the memory cells depicted in FIGS. 1 and 2 can also be determined, for example, by driving a fixed DC current, for example, but not limited to, 1 µA, through the series combination of the FET device (130 in FIG. 1 and 230 in FIG. 2) and the resistive change element (110 in FIG. 1 and 210 in FIG. 2) while applying a voltage to the gate (130c in FIG. 1 and 230c in FIG. 2) sufficient to turn on the FET device (130 in FIG. 1 and 230 in FIG. 2) and measuring the voltage across the resistive change element (110 in FIG. 1 and 210 in FIG. 2).

It should be noted that while FIGS. 1 and 2 depict exemplary resistive change memory cells that include FET selection devices, the methods of the present disclosure are not limited in this regard. Indeed, resistive change memory cells can use other electrical circuit elements (diodes, for example, as taught within U.S. Pat. No. 8,513,768, incorporated herein by reference in its entirety) as selection devices. Further, within certain applications, resistive change element memory cells can be comprised of a resistive change memory element alone with no selection device at all. Such cells (sometimes referred to as "1-R" or "crosspoint" arrays) are taught, for example, in U.S. Pat. No. 9,263,126, incorporated herein by reference in its entirety. The programming methods of the present disclosure of well suited for use with all of these types of resistive change memory cell configurations and are not limited by the type or presence (or lack thereof) of an in situ selection device within the cell.

The resistive change element (such as, but not limited to, those depicted in FIGS. 1 and 2) can be formed from a plurality of materials, such as, but not limited to, metal oxide, solid electrolyte, phase change material such as a chalcogenide glass, and carbon nanotubes.

For example, U.S. patent application Ser. No. 11/280,786 to Bertin et al., incorporated herein by reference, discloses a two terminal nanotube switching device comprising a first and second conductive terminals and a nanotube article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a bit of information.

While some examples of resistive change memory cells and elements within the present disclosure specifically reference carbon nanotube based resistive change memory cells and elements, the methods of the present disclosure are not limited in this regard. Indeed, it will be clear to those skilled in the art that the methods of the present disclosure are applicable to any type of resistive change memory cell or element.

FIGS. 3A-3D are exemplary schematics of programming circuits which can be used to generate and apply electrical stimuli, for example, individual programming pulses or pulse trains, to a resistive change element within a resistive change memory cell.

Figure 3B:
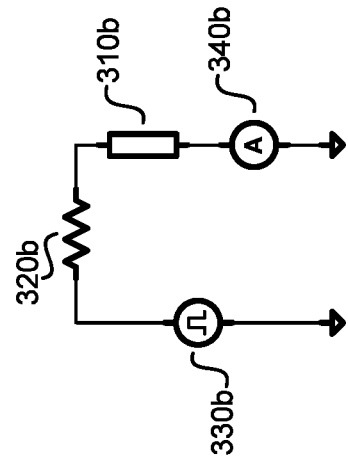
FIGS. 3A-3D are schematics illustrating exemplary programming circuits for programming and reading the state of a resistive change memory cell.
Figure 3A:
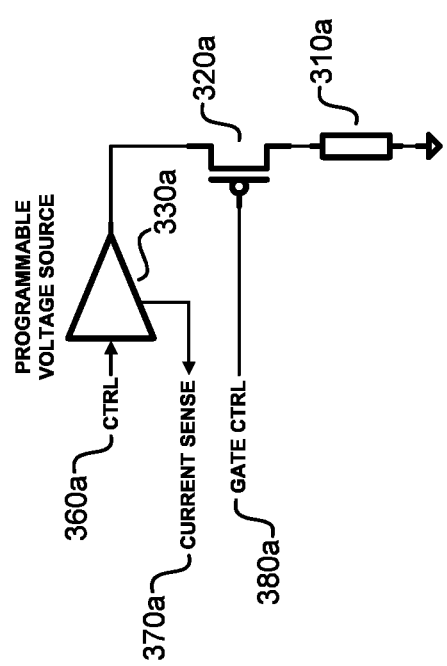

Referring now to FIG. 3A, a first programming circuit is depicted. A programmable voltage source 330a is used to apply a programming voltage across a resistive change memory cell represented by FET device 320a (analogous to the FET devices of FIGS. 1 and 2) and resistive change element 310a (analogous to the resistive change elements of FIGS. 1 and 2). Programmable voltage source 330a is responsive to an external control 360a (supplied, for example, from a software controlled algorithm executed within a microprocessor or microcontroller, or from an FPGA or hardware control circuit). Programmable voltage source 330a also provides a feedback output 370a indicating the current it is supplying during operation. This feedback output 370a can be used to read the state of resistive change element 310a between programming operations.

Referring now to FIG. 3B, a second programming circuit is depicted. A pulse generator 330b is placed across a resistive change memory cell represented by fixed resistor 320b (which replaces the FET devices of FIGS. 1 and 2 as a current limiting device) and resistive change element 310b (analogous to the resistive change elements of FIGS. 1 and 2). An ammeter 340b is wired in series with resistive change element 310b. In this way, pulse generator 330b can be used to apply programming stimuli and ammeter 340b used to monitor current through the resistive change element 310b. Within such a circuit, the pulse generator 330b is can be used to apply both programming stimuli (in order to adjust the resistive state of resistive change element 310b) and test voltages (in order to read the resistive state of resistive change element 310b).

Figure 3C:
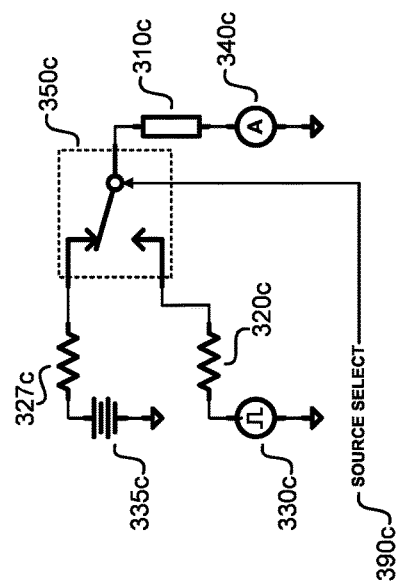

Referring now to FIG. 3C, a third programming circuit is depicted. A pulse generator 330c and a fixed voltage supply 335c are connected through a relay switching device 350c to resistive change element 310c (analogous to the resistive change elements of FIGS. 1 and 2). The relay switching device 350c, responsive to an external control 390c, selects between the pulse generator 330c (which provides programming stimuli through fixed resistor 320c) and the fixed voltage supply 335c (which provides test voltages through fixed resistor 327c). As within the circuit of FIG. 3B, an ammeter 340c is wired in series with resistive change element 310c to monitor current through the resistive change element 310c during read cycles.

Figure 3D:
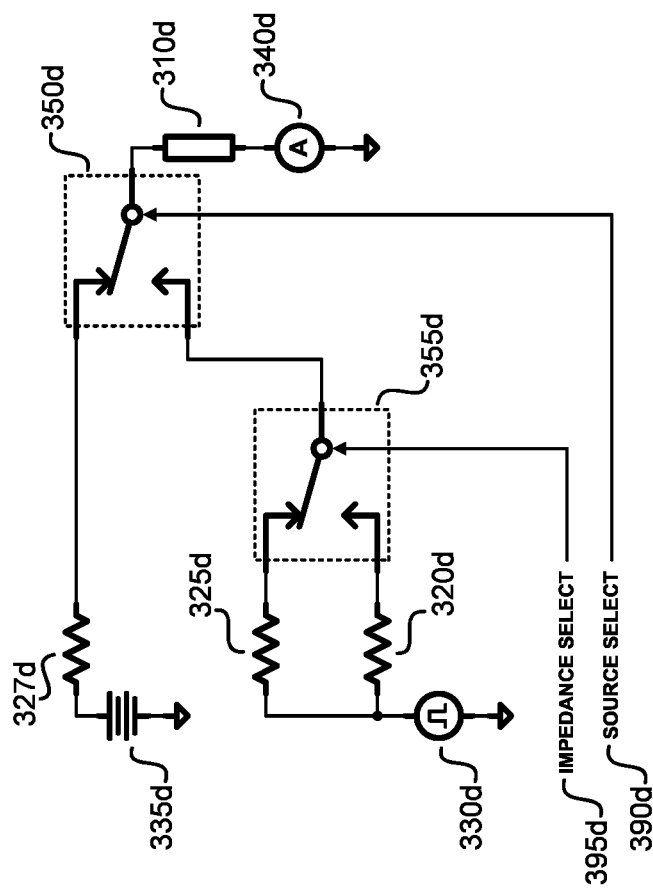

Referring now to FIG. 3D, a fourth programming circuit is depicted. A pulse generator 330d and a fixed voltage supply 335d are connected through a first relay switching device 350d to resistive change element 310d (analogous to the resistive change elements of FIGS. 1 and 2). The relay switching device 350d, responsive to an external control 390d, selects between the pulse generator 330d (which provides programming stimuli through one of two fixed resistors 320d or 325d) and the fixed voltage supply 335d (which provides test voltages through fixed resistor 327d). A second relay switching device 355d provides a control to select between a first current limiting resistor 320d and a second current limiting resistor 325d in series with pulse generator 330d. In this way, the value of the current limiting series resistor (analogous to the FET devices of FIGS. 1 and 2) used within a programming operation can be adjusted between programming pulses. As within the circuits of FIGS. 3B and 3C, an ammeter 340d is wired in series with resistive change element 310d to monitor current through the resistive change element 310d during read cycles.

Within the programming of one-bit resistive change memory cells, two types of programming operations are employed. A SET operation is used to adjust a resistive change element from a high resistive state to a low resistive state. For example, an electrical stimulus is applied to the resistive change element until the resistance of the resistive change element is below a predefined set resistance threshold. A RESET operation is used to adjust a resistive change element from a low resistive state to a high resistive state. For example, an electrical stimulus is applied to the resistive change element until the resistance is above a predefined reset resistance threshold. Under an aspect of the present disclosure, both operations will include applying electrical stimulus in the form of pulse trains—that is, a rapidly applied series of sub-pulses—to the resistive change element being programmed. In this way, the resistive change element is driven into a stable resistive state by the conclusion of the SET or RESET operation.

The voltage levels used for a RESET operation may be higher than those used for a SET operation, and within the methods of the present disclosure, the pulse train used in a SET operation is sometimes applied through a fixed series resistance to limit the current through the resistive change element. Similarly, the pulse width, duty cycle, and voltage level of the sub-pulses within an applied pulse train used in a programming operation are selected according to specific applications. For example, the physical dimensions of the resistive change element, the type of resistive change element used, and the specific SET and RESET threshold values used all factor into the specific voltage level, pulse width, and duty cycle of the pulse train applied.

For example, within an exemplary carbon nanotube-based memory cell, wherein a carbon nanotube fabric layer is used as a resistive change element, a SET resistance threshold value can be on the order of 1MΩ and a RESET resistance threshold can be on the order of 10MΩ. In such an application voltage level of the pulse train used in a SET operation might range from 2V to 4V (applied, for example, through a 500 kΩ fixed series resistance) with pulse widths ranging from 5 μs to 5 ms. In the same application the pulse train used in a reset operation might range from 4V to 6V with pulse widths ranging from 500 ns to 1000 ns. It should be noted that the preceding example is provided only to illustrate a set of typical SET and RESET parameters for an exemplary resistive change memory cell. As such, the methods of the present disclosure should not be limited to such parameters.

Hysteresis is typically built into the resistance thresholds within resistive change memory cells in order to allow for an unambiguous read operation. That is, the set resistance threshold value and the reset resistance threshold value are typically offset from each other by some range, providing a range of resistance values between these threshold values for which the resistive change element is neither in a set nor in a reset state. This undefined range is typically referred to as the "grey-zone" or "buffer zone."

Figure 4A:
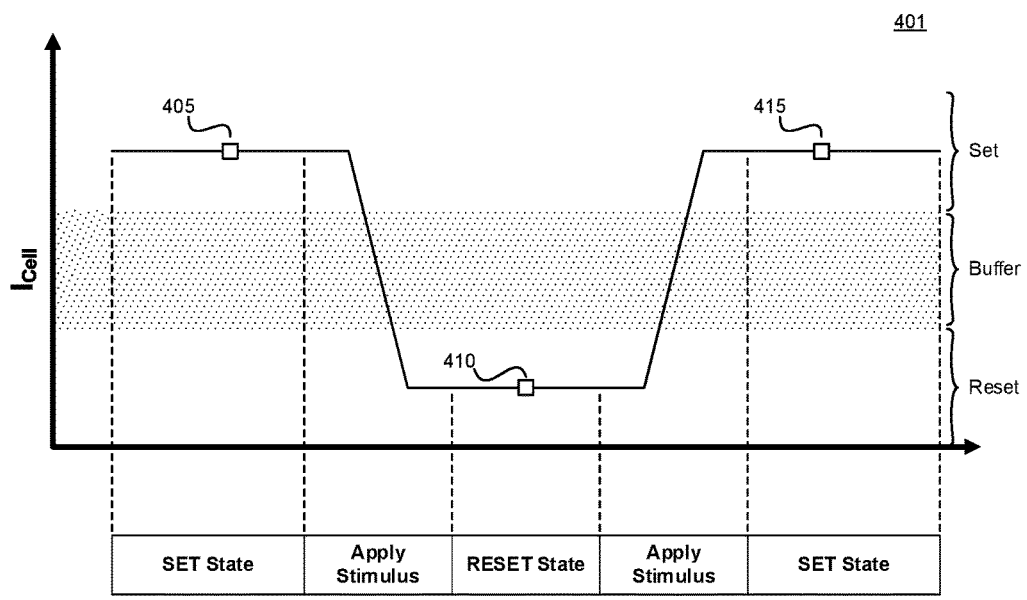
FIG. 4A is an exemplary diagram of a programming cycle performed on an resistive change memory cell as it is adjusted between two valid resistive states.

FIG. 4A is a waveform plot 401 illustrating the adjustment of a resistive change cell between two states—a low resistive "SET" state, and a high resistive "RESET" state. Waveform plot 401 tracks cell current on the vertical axis over time and is divided into three horizontal regions: "Set" (corresponding to a range of cell current values indicative of a low resistive state), "Reset" (corresponding to a range of cell current values indicative of a high resistive state), and "Buffer" (corresponding to an invalid region between the SET and RESET states.

As shown in FIG. 4A, the exemplary resistive change cell adjusted within waveform plot 401 is initially in SET state 405. A programming stimulus is applied, and the resistive change cell is adjusted into RESET state 410. A second programming stimulus is then applied, and the resistive change memory cell is adjusted a second time into SET state 415.

Figure 4B:
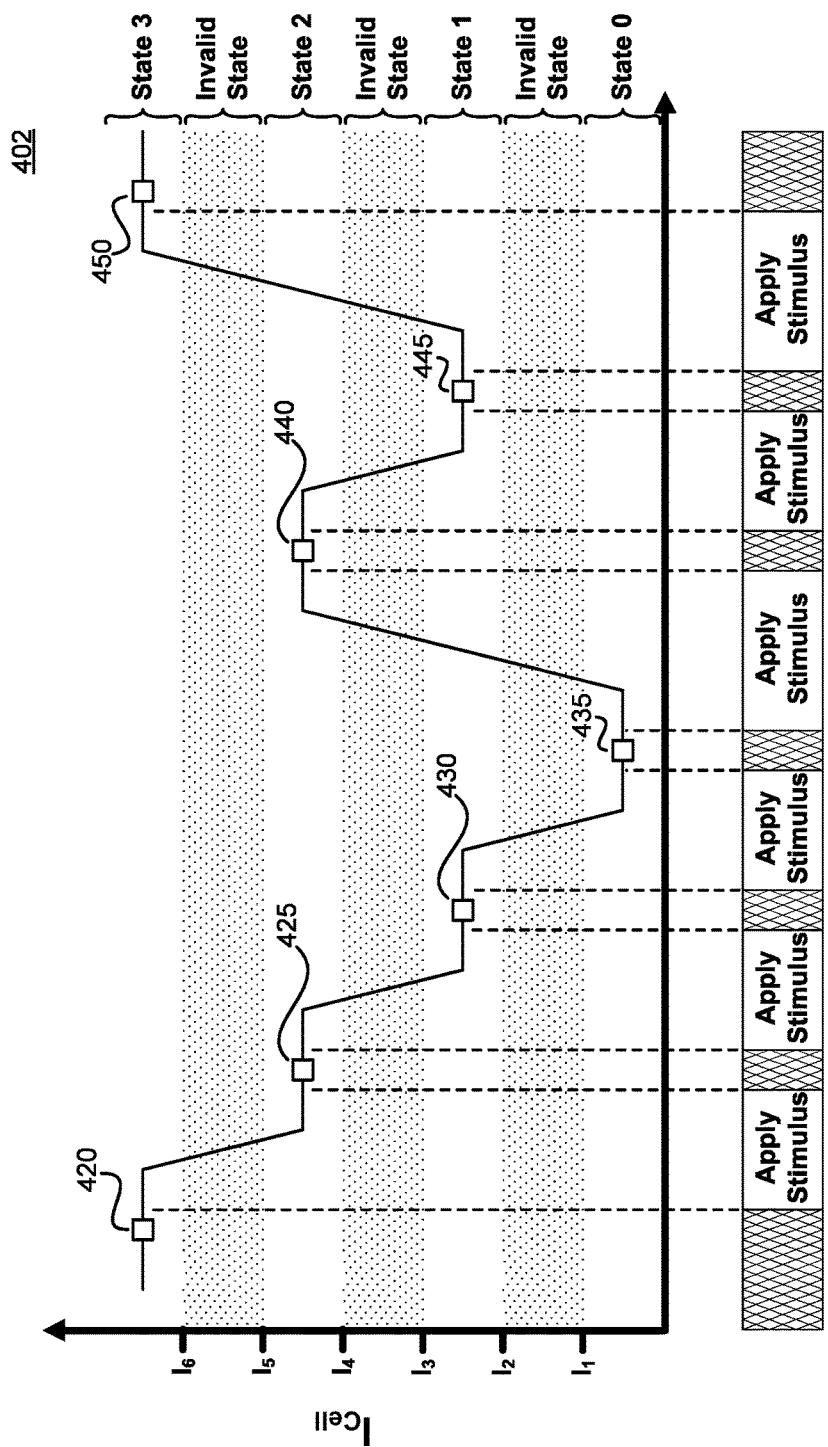
FIG. 4B is an exemplary diagram of a programming cycle performed on a resistive change memory cell as it is adjusted among four valid resistive states.

Similarly, FIG. 4B is a waveform plot 402 illustrating the adjustment of a resistive change cell among four states. Waveform plot 402 tracks cell current on the vertical axis over time and is divided into seven horizontal regions: valid states 0, 1, 2, and 3 separated by buffer zones of invalid states. As shown in FIG. 4B, the exemplary resistive change cell adjusted within waveform plot 402 is initially in State 3 420. Responsive to a series of applied stimuli, the cell is first adjusted into State 2 425, then into State 1 430, then into State 0 435, then back up to State 2 440, then back down to State 1 445, and finally back up to State 3 450.

Within many applications employing resistive change cells, it is important that the resistive state of a programmed cell remain substantially fixed over time—that is, that the programmed resistance of the cell does not drift.

For example, if the programming operation depicted in waveform plot 401 depicted the setting and resetting a memory cell (the SET states 405 and 415 corresponding to a logic '1' and the RESET state 410 corresponding to a logic '0,' for example), the device may become unusable if the initial resistance of programmed state 410 were to drift into the buffer region of the plot. That is, if the RESET state 410 were not substantially stable and the resistance of the cell decreased over time such that a read operation returned a value between $I_{SET}$ and $I_{RESET}$, the memory cell—originally programmed to a logic '0'—would return an ambiguous reading.

In another example, if the programming operation depicted in waveform plot 402 depicted the adjustment of a voltage divider element within a logic device (each of the four valid states corresponding to a different output voltage level, for example), than drift between the valid states might provide unexpected output voltages to any circuitry responsive to the voltage divider element.

For such applications, it is thus highly desirable that resistive change cells are programmed in such a way as to render the cell into stable, non-volatile resistive states that will not drift substantially over time.

FIGS. 5A-5C depict three exemplary programming stimuli for adjusting the state of a resistive change cell.

FIG. 5A depicts a first programming stimulus 501 comprising a single voltage pulse. Within first programming stimulus 501, a voltage $V_P$ is driven across a resistive change cell to be programmed for a fixed programming time $t_P$. As will be shown in FIGS. 7A-7C, 8A-8C, and 9A-9C, the use of a single pulse such as 501 for programming a resistive change memory cell—in certain applications—may tend to render resistive changes cells into unstable or metastable states, resulting in significant resistance drift over time.

FIG. 5B depicts a second programming stimulus 502 comprising a short pulse train made up of a plurality of sub-pulses. Within second programming stimulus 502, $V_P$ is driven across a resistive change cell to be programmed in a series of short "sub-pulses" over a fixed programming time $t_P$. As shown in FIG. 5B, each sub-pulse within programming stimulus 502 drives $V_P$ across a resistive change cell to be programmed for a time $t_1$, and then goes low for a time $t_2$. These sub-pulses are repeated and applied in immediate succession over time $t_P$. As will be shown in FIGS. 10A-10C, 11A-11C, and 12A-12C, the use of a short pulse train as shown in FIG. 5B as a programming stimulus will tend to drive resistive change elements into stable states, significantly reducing drift.

FIG. 5C depicts a third programming stimulus 503 comprising a long pulse train made up of a plurality of sub-pulses. Within third programming stimulus 503, $V_P$ is driven across a resistive change cell to be programmed in a series of short "sub-pulses" over a fixed programming time $t_P$. It should be noted that the programming time $(t_P)$ used with a programming stimulus like that depicted in FIG. 5C may be significantly longer than the programming time $(t_P)$ of a programming stimulus that is depicted in FIG. 5B. As shown in FIG. 5C, programming stimulus 503 drives $V_P$ across a resistive change cell to be programmed for a time $t_3$, and then goes low for a time $t_4$. These subpulses are repeated and applied in immediate succession over time $t_P$. As will be shown in FIGS. 13A-13C, 14A-14C, and 15A-15C, the use of a long pulse train as shown in FIG. 5C as a programming stimulus will tend to drive resistive change cells into stable states, significantly reducing drift.

The present disclosure uses the term "pulse trains" (as depicted in FIGS. 5B and 5C, and discussed above) to refer to a long or short burst of sub-pulses applied in immediate and rapid succession to successively stimulate resistive change material within a resistive change element multiple times. Such pulse trains could take the form of, for example, a square wave driven at a fixed frequency and duty cycle. The duty cycle, frequency, and voltage level of pulse trains can be selected as befits the needs of a particular application. A pulse train suitable for use with the programming methods of the present disclosure could have, for example, but not limited to, a duty cycle on the order of 20%, 50%, or 80%, a frequency on the order of 100 kHz, 1 MHz, 10 MHz, and a voltage level on the order of 1V, 3V, 5V, or 10V. Further, according to certain aspects of the present disclosure, a pulse train comprises a series of voltage pulses applied with a fixed periodicity over a fixed programming time.

Without wishing to be bound by theory, the present disclosure submits that—in certain applications—driving resistive change memory cells with trains of sub-pulses (as depicted in FIGS. 5B and 5C will rapidly and repeatedly stimulate the resistive change material (elements) within the resistive change memory cells multiple times. These additional adjustments will tend to correct any unstable or metastable states within resistive change material as the sub-pulses are applied. In this way, the programming methods of the present disclosure use pulse trains to adjust resistive change cells into stable, non-volatile states that exhibit significantly less drift over time.

Figure 6:
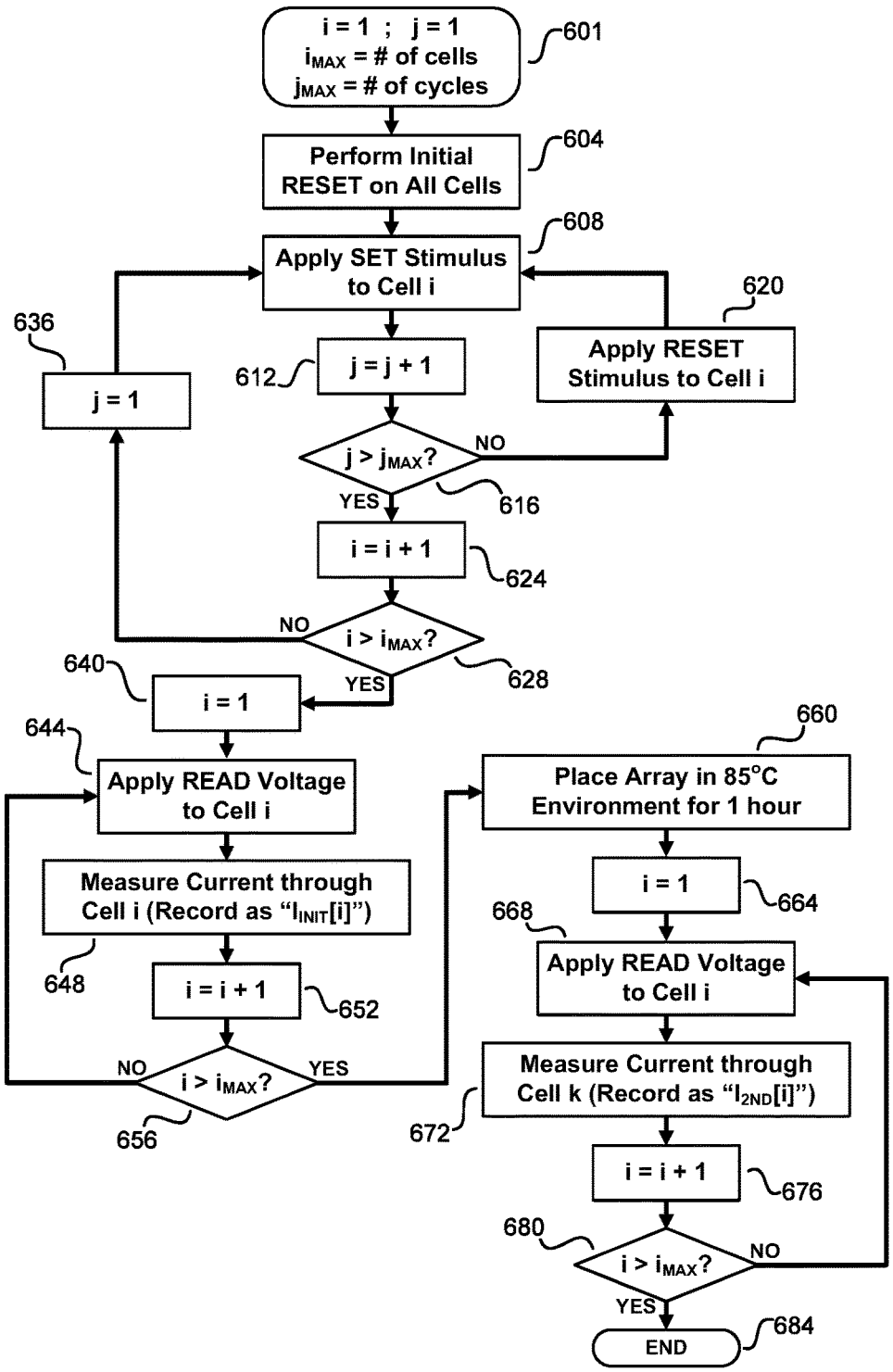
FIG. 6 is a flow chart describing a testing procedure used to demonstrate the methods of the present disclosure and to realize the data plots of FIGS. 7A-7C, 8A-8C, 9A-9C, 10A-10C, 11A-11C, 12A-12C, 13A-13C, 14A-14C, and 15A-15C.

FIG. 6 is a flow chart describing a test procedure used to demonstrate the methods of the present disclosure. An array of two-terminal nanotube switching devices (as taught by Bertin in Ser. No. 11/280,786 and discussed previously within the previous disclosure) was divided into nine subgroups. Each subgroup was then programmed for a certain number of cycles (1, 5, or 20) using one of three programming stimuli. A cycle, as is detailed in FIG. 6, involves first driving a two-terminal nanotube switching device into a high resistive state (a "RESET" condition) and then driving the device back into a low resistive state (a "SET" condition). The three programming stimuli included:

a single pulse (analogous to the waveform depicted in FIG. 5A with $V_P$=1.1V and $t_P$=500 µs);

a long pulse train (analogous to the waveform depicted in FIG. 5C with $V_P$=1.75V, $t_P$=500 µs, $t_3$=100 ns, and $t_4$=100 ns); and a short pulse train (analogous to the waveform depicted in FIG. 5B with $V_P$=1.75V, $t_P$=50 µs, $t_1$=100 ns, and $t_2$=100 ns).

Immediately after the conclusion of the programming operation, the programmed state of each of the nanotube switching devices in each subgroup was recorded at 25° C. The array was then subjected to an 85° C. bake process for one hour (the individual devices were essentially stored at 85° C. for one hour to provide an accelerated life test). The array was then returned to 25° C. and a second measurement reading was taken on each device. These nine data sets were then compiled into the plots depicted in FIGS. 7A-7C, 8A-8C, 9A-9C, 10A-10C, 11A-11C, 12A-12C, 13A-13C, 14A-14C, and 15A-15C.

Referring now to FIG. 6, at the start of the test procedure 601 the looping variables are initialized. The looping variable "i" is used to keep track of which nanotube switching device in the subgroup is being adjusted, and the constant $i_{MAX}$ is used to represent the number of devices within the subgroup. The looping variable "j" is used to keep track of the cycle number (how many times each device will be RESET and then SET prior to recording data), and the constant $j_{MAX}$ is used to keep track of how many cycles are to be performed on the subgroup (1, 5, or 20 for the purposes of the data within this disclosure).

Within the next process step 604 an initial RESET is performed on all nanotube switching devices within the subgroup. This is typically a higher voltage RESET operation used to initialize nanotube switching devices being programmed for the first time. On the next process step 608, the first nanotube switching device is SET according to the preselected programming parameters for the current subgroup (as described above). The looping variable j is then incremented (process step 612) and then compared against the number of cycles to be performed on each cell (process step 620). If the testing parameters call for multiple cycles on each device ($j_{MAX}>1$), then the procedure will RESET the current device again (process step 620) and then return to process step 608 where it will SET the device again. Once the number of cycles are complete—or if the testing parameters only call for a single cycle on each devices ($j_{MAX}=1$)—the procedure will proceed to the next device, incrementing the looping variable i in process step 624, checking to see if all the devices have been programmed in process step 628, and then resetting the looping variable j before returning to process step 608.

Once all the devices in the subgroup have been programmed for the desired number of cycles (once $i>i_{MAX}$), the programming sequence completes and the initial read sequence begins at process step 640 with looping variable i being reset to 1. In process step 644 a READ voltage is applied across the first device, and the resulting current is measured in process step 648. This resulting current is indicative of the resistive state of the nanotube switching device and is recorded as $I_{INIT}[i]$—that is, the initial SET value of the device immediately after programming. This value will be compared against another reading taking on the same device after process step 660 (a high temperature bake to simulate stress on the cells) to measure drift within the cell. Process steps 652 and 656 and then used to loop through the initial read sequence and record initial SET values for every device in the subgroup.

Once every device in the subgroup has been measured and recorded, the array is placed in a high temperature environment for one hour (process step 660) to simulate stress on the cells. A second read sequence is then begun with process steps 664 (resetting looping variable i back to 1), 668 (applying the read voltage again), 672 (measuring and recording the current through the device a second time), 676, and 680 (incrementing and looping the sequence such that all devices are read a second time). Once all the nanotube switching devices have been measured and recorded for a second time, the algorithm ends with process step 684.

As previously described, the testing algorithm of FIG. 6 was used to demonstrate the methods of the present disclosure by applying three different programming stimuli in combination with different numbers of programming cycles over nine subgroups of a nanotube switching array (as summarized in Table 1).

TABLE 1

| Subgroup | Programming Stimulus | Cycles | FIGS. |
|---|---|---|---|
| 1 | 1.1 V Single Pulse for 500 µs | 1 | 7A-7C |
| 2 | 1.1 V Single Pulse for 500 µs | 5 | 8A-8C |
| 3 | 1.1 V Single Pulse for 500 µs | 20 | 9A-9C |
| 4 | 1.75 V, 5 MHz Square Wave for 500 µs | 1 | 10A-10C |
| 5 | 1.75 V, 5 MHz Square Wave for 500 µs | 5 | 11A-11C |
| 6 | 1.75 V, 5 MHz Square Wave for 500 µs | 20 | 12A-12C |
| 7 | 1.75 V, 5 MHz Square Wave for 50 µs | 1 | 13A-13C |
| 8 | 1.75 V, 5 MHz Square Wave for 50 µs | 5 | 14A-14C |
| 9 | 1.75 V, 5 MHz Square Wave for 50 µs | 20 | 15A-15C |

For their respective groups, FIGS. 7A, 8A, 9A, 10A, 11A, 12A, 13A, 14A, and 15A plot the initial current reading taken on each cell (obtained in process step 648 in FIG. 6) on the horizontal axis against the second current reading taken on each cell (obtained in process step 672 in FIG. 6) on the vertical axis for each of the nine test runs (discussed below). Ideally, plotted in this configuration, all data points should reside on a straight line with a slope of 1 and a vertical intercept of 0 (essentially the line y=x) and deviation from this line in indicative of the amount of drift experienced within in the cells during process step 660.

For their respective groups, FIGS. 7B-7C, 8B-8C, 9B-9C, 10B-10C, 11B-11C, 12B-12C, 13B-13C, 14B-14C, and 15B-15C plot the binning results—that is, the number of cells quantized into each value bin as indicated on the horizontal axes of each figure—of both the initial read operation (process step 648 in FIG. 6) and the second read operation (process step 672 in FIG. 6). Both plots depict the binning results of each read operation separately: the initial read operation with open squares and a solid line, and the second read operation with closed triangle and a dashed line. The plots within FIGS. 7B, 8B, 9B, 10B, 11B, 12B, 13B, 14B, and 15B display the binning results of each bin separately, while the plots within FIGS. 7C, 8C, 9C, 10C, 11C, 12C, 13C, 14C, and 15C display the cumulative binning (that is, each bin value contains all devices of the bins below it).

Figure 7A:
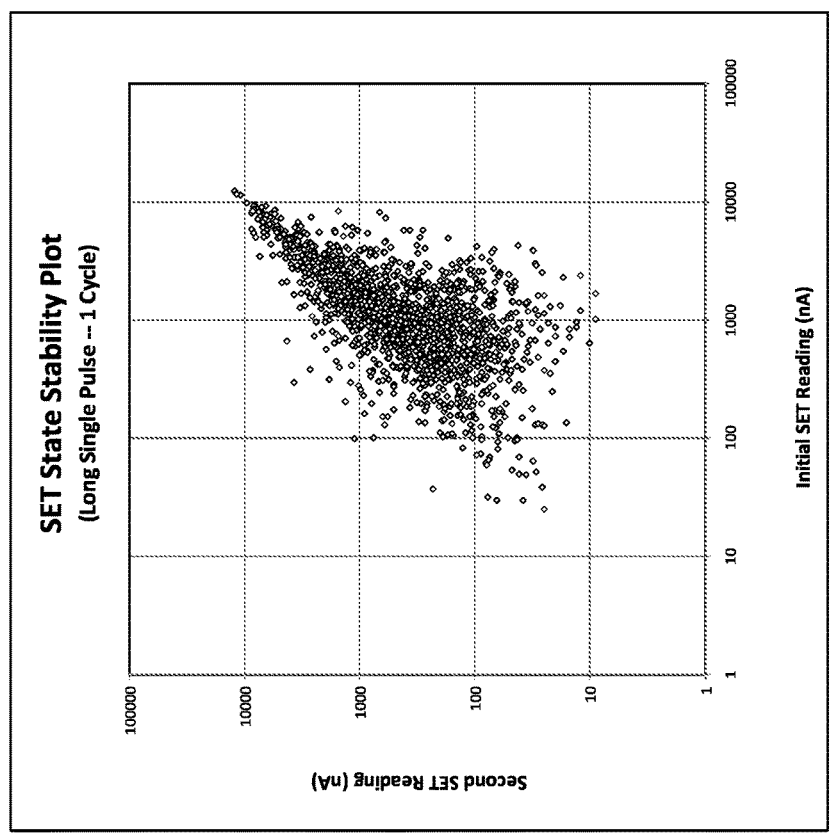
FIGS. 7A-7C are data plots depicting the stability of a resistive change cell array programmed over a single cycle (using the procedure depicted in FIG. 6) via the application of a single voltage pulse.
Figure 7B:
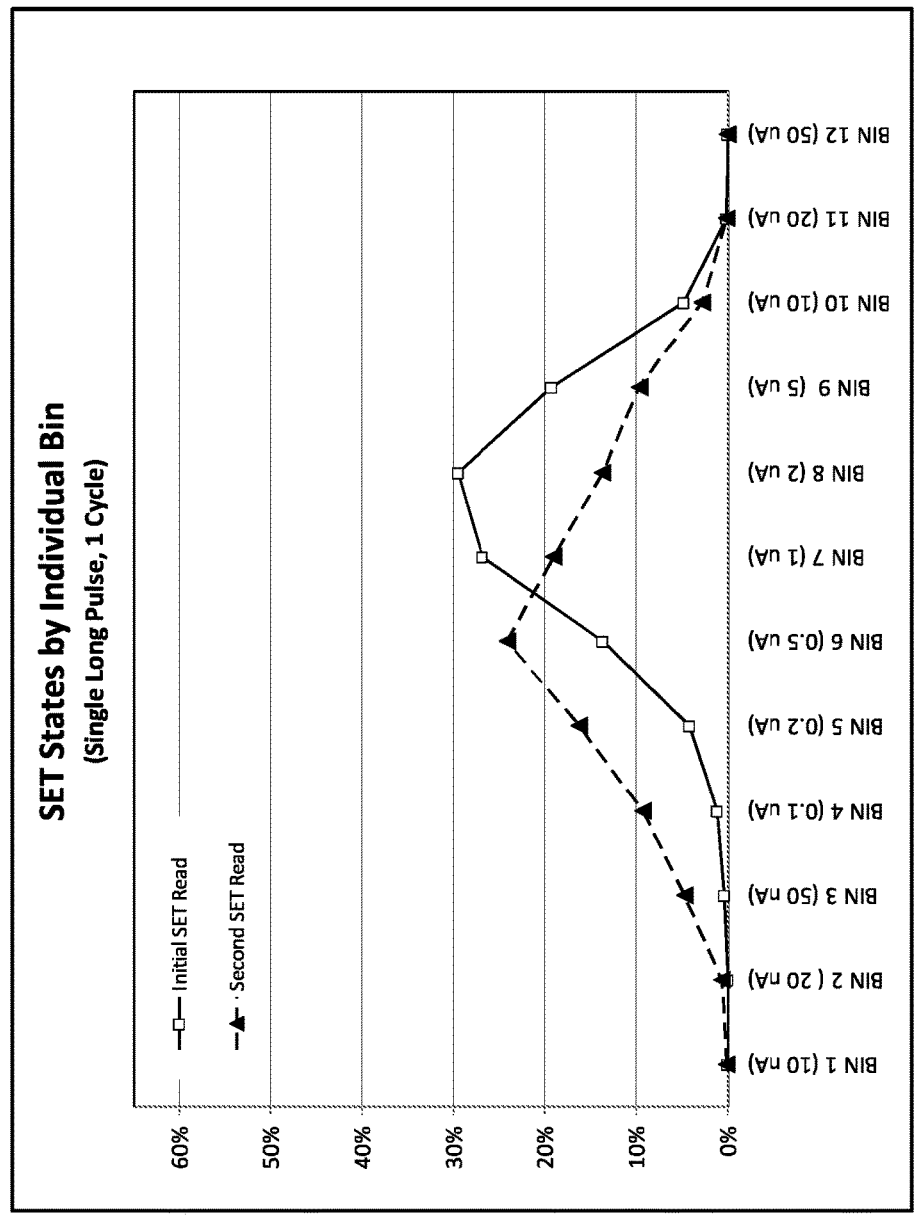
Figure 7C:
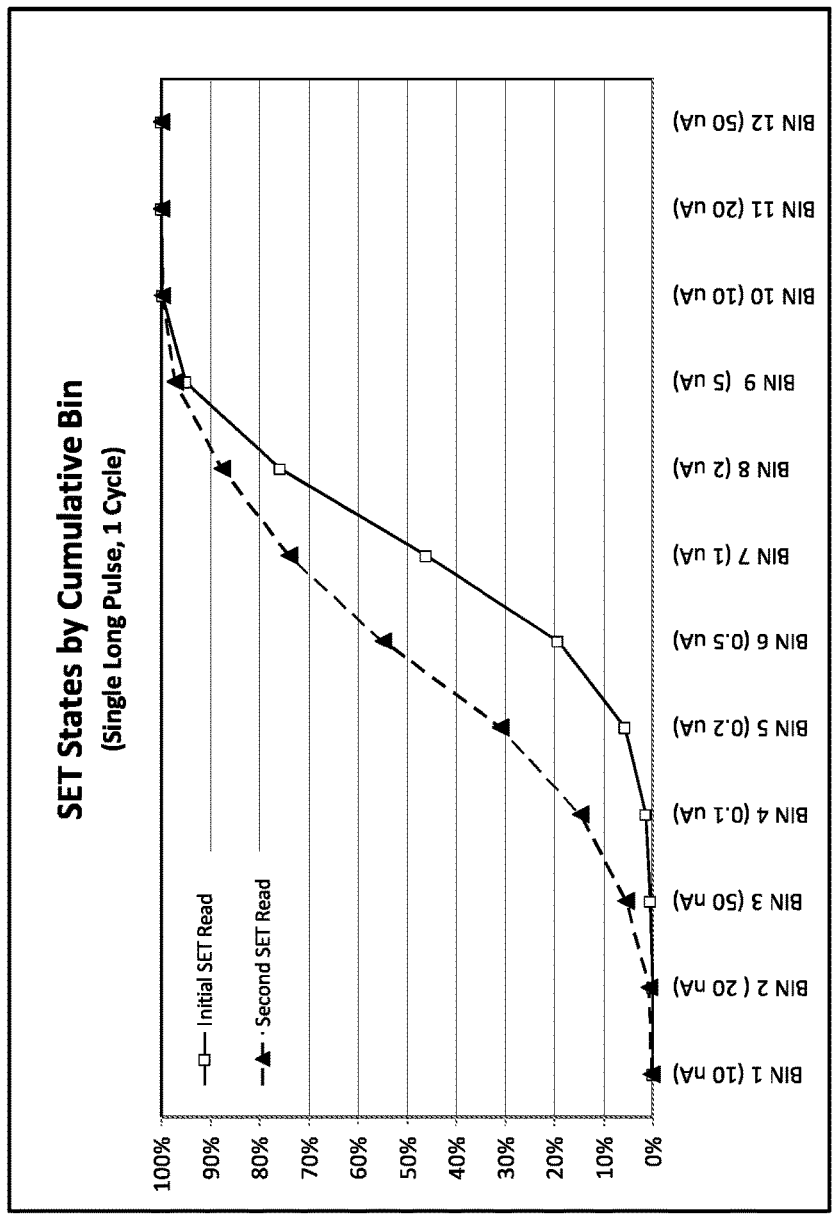

FIGS. 7A-7C plot the data recorded as the testing algorithm depicted in FIG. 6 was run on a subgroup #1 (1651 nanotube switching devices) using a single pulse (1.1V for 500 µs) for a single programming cycle. As can be seen in the plots of FIG. 7A-7C, this testing run—using a single pulse over one cycle—resulted in significant drift.

Figure 8A:
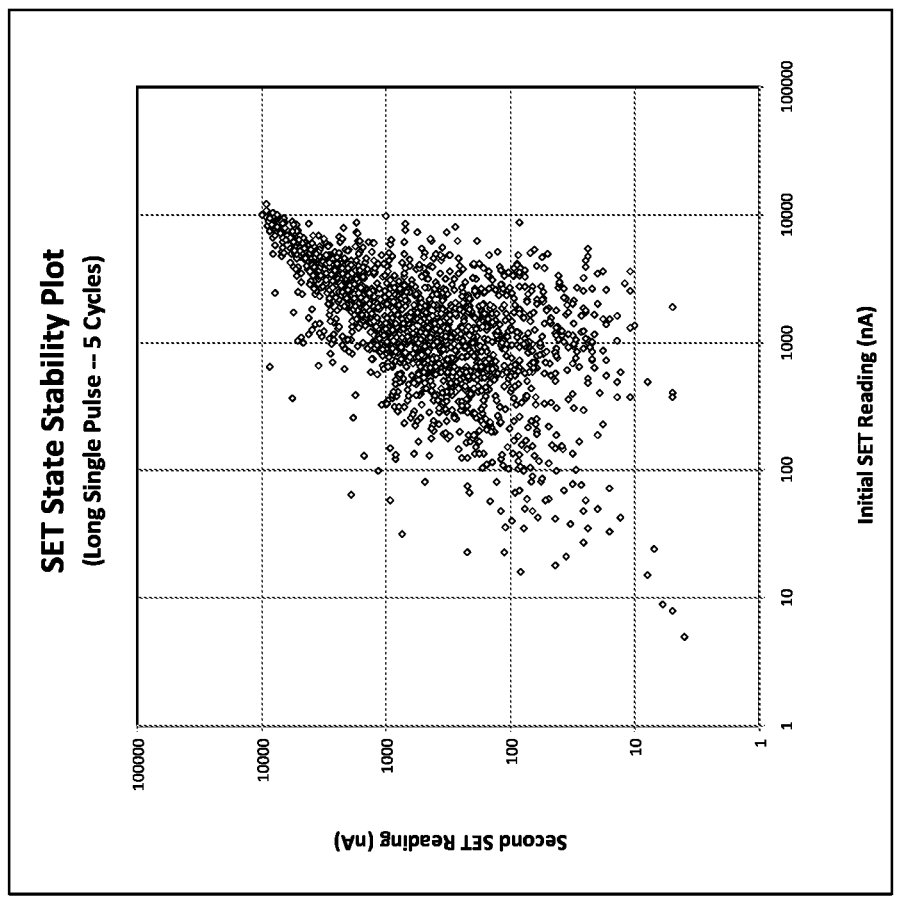
FIGS. 8A-8C are data plots depicting the stability of a resistive change cell array programmed through five cycles (using the procedure depicted in FIG. 6) via the application of a single voltage pulse.
Figure 8B:
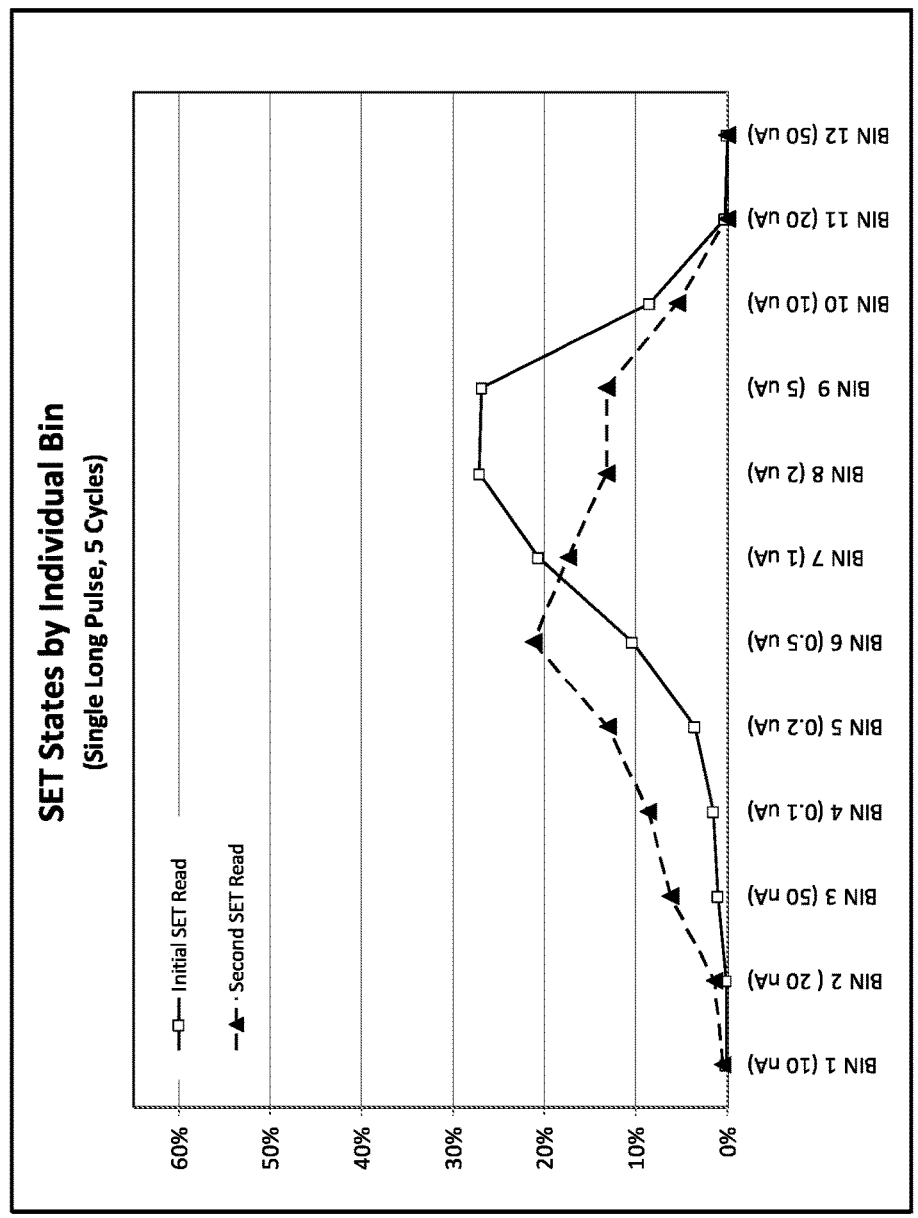
Figure 8C:
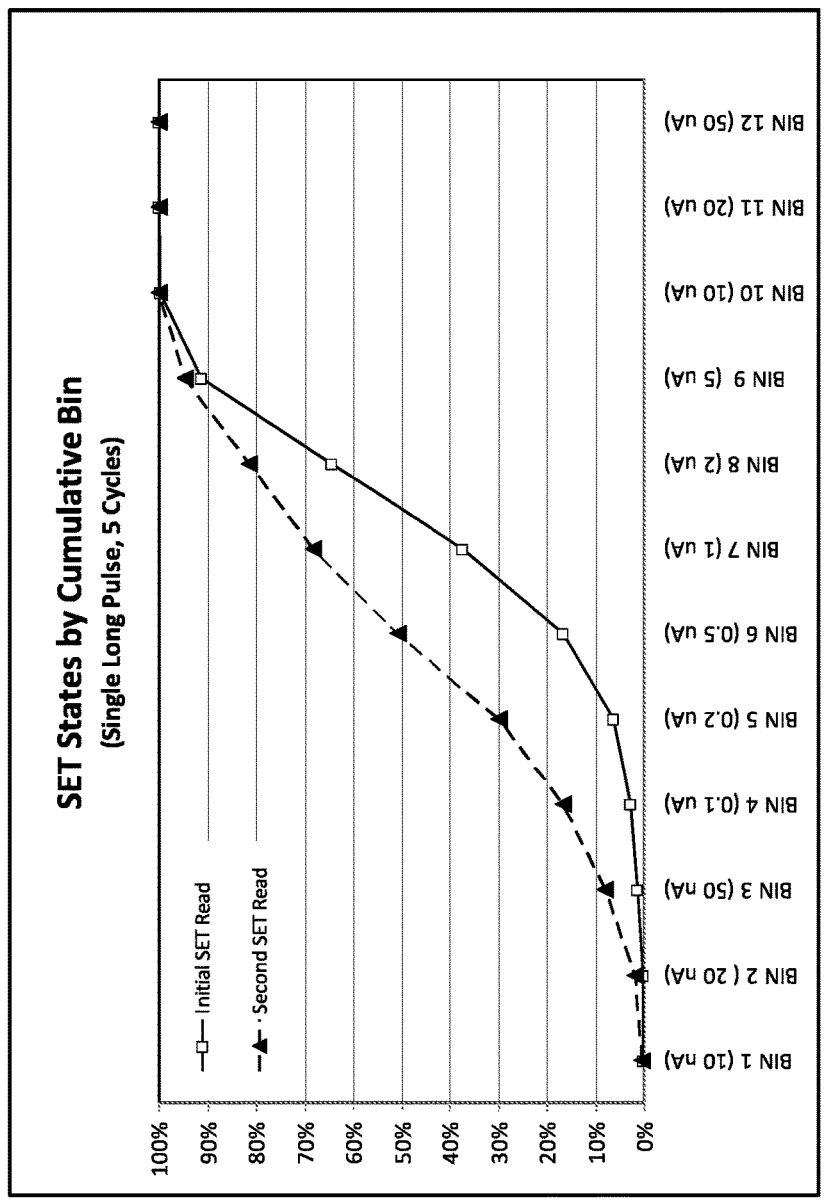

FIGS. 8A-8C plot the data recorded as the testing algorithm depicted in FIG. 6 was run on a subgroup #2 (1763 nanotube switching devices) using a single pulse (1.1V for 500 µs) for a five programming cycles per device. As can be seen in the plots of FIG. 8A-8C, this testing run—using a single pulse over five cycles—resulted in significant drift.

Figure 9A:
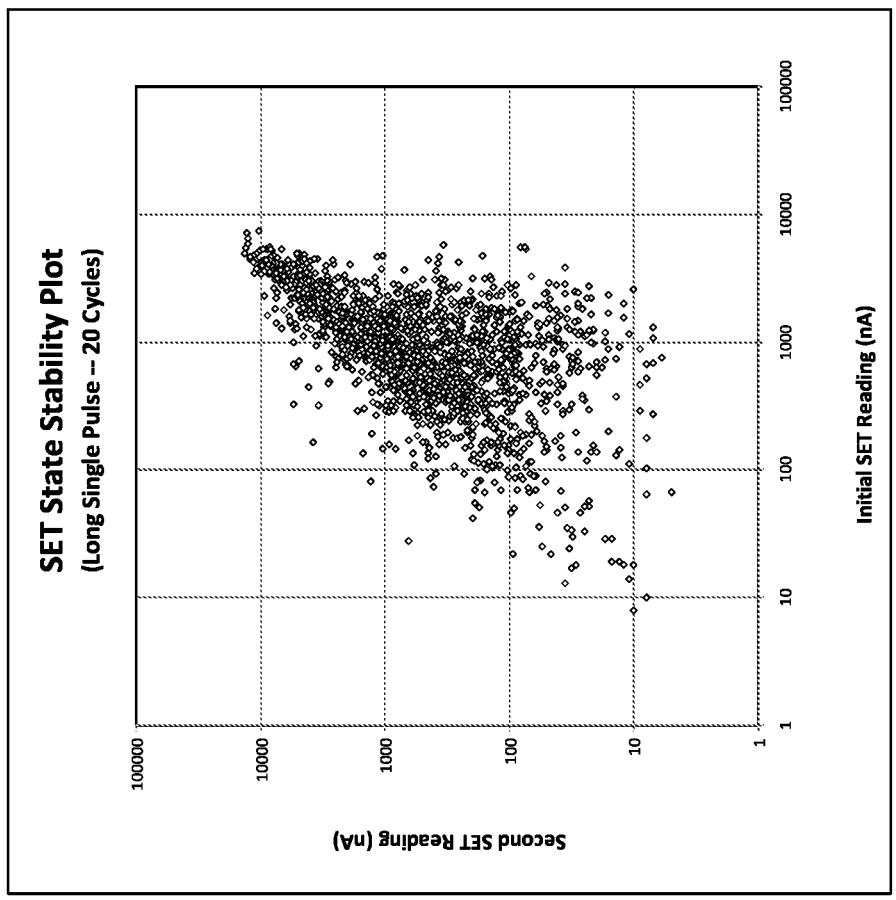
FIGS. 9A-9C are data plots depicting the stability of a resistive change cell array programmed through twenty cycles (using the procedure depicted in FIG. 6) via the application of a single voltage pulse.
Figure 9B:
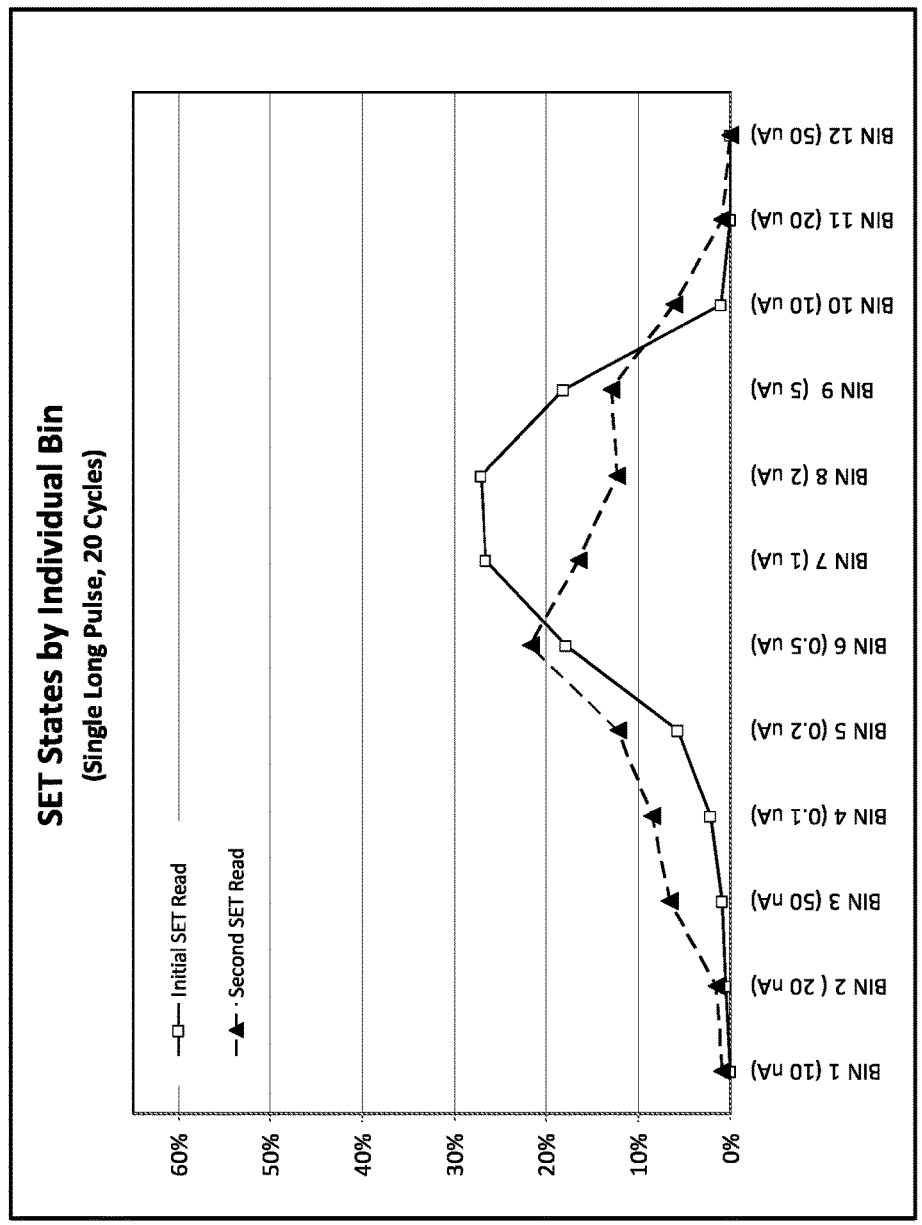
Figure 9C:
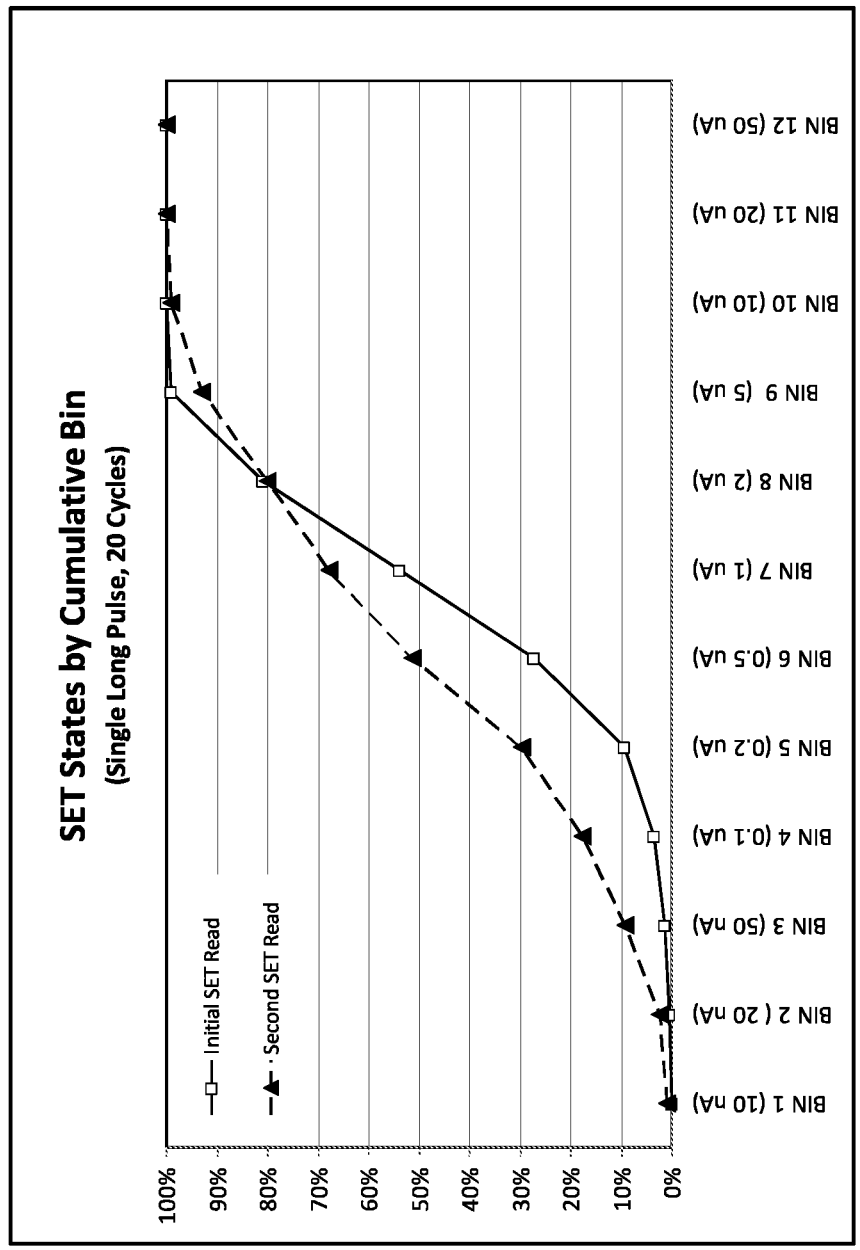

FIGS. 9A-9C plot the data recorded as the testing algorithm depicted in FIG. 6 was run on a subgroup #3 (1732 nanotube switching devices) using a single pulse (1.1V for 500 µs) for a twenty programming cycles per device. As can be seen in the plots of FIG. 9A-9C, this testing run—using a single pulse over twenty cycles—resulted in significant drift.

Figure 10A:
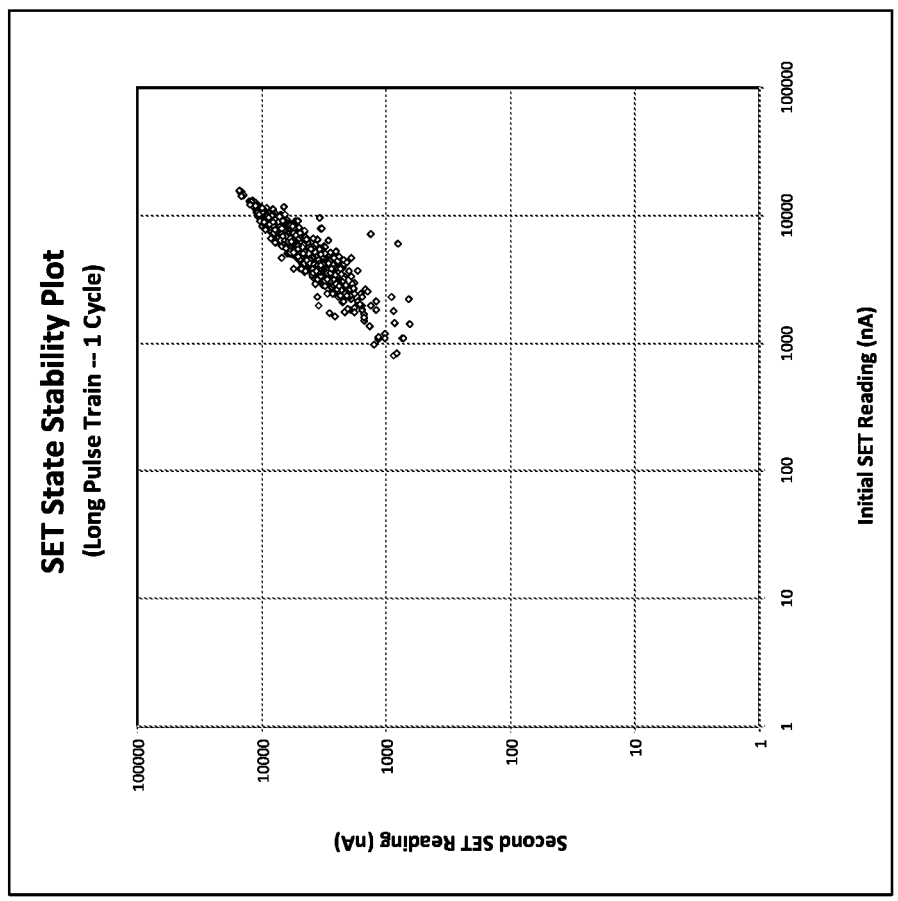
FIGS. 10A-10C are data plots depicting the stability of a resistive change cell array programmed over a single cycle (using the procedure depicted in FIG. 6) via the application of a long pulse train.
Figure 10B:
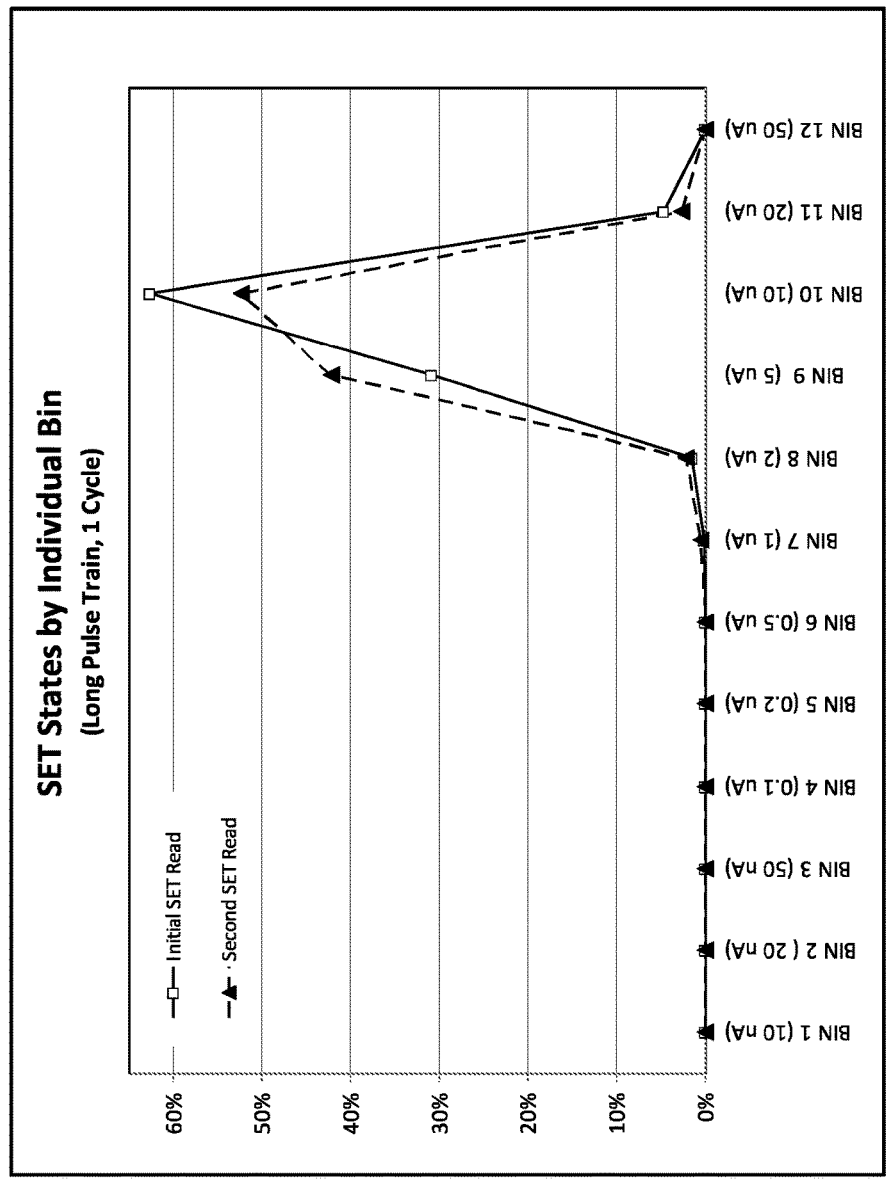
Figure 10C:
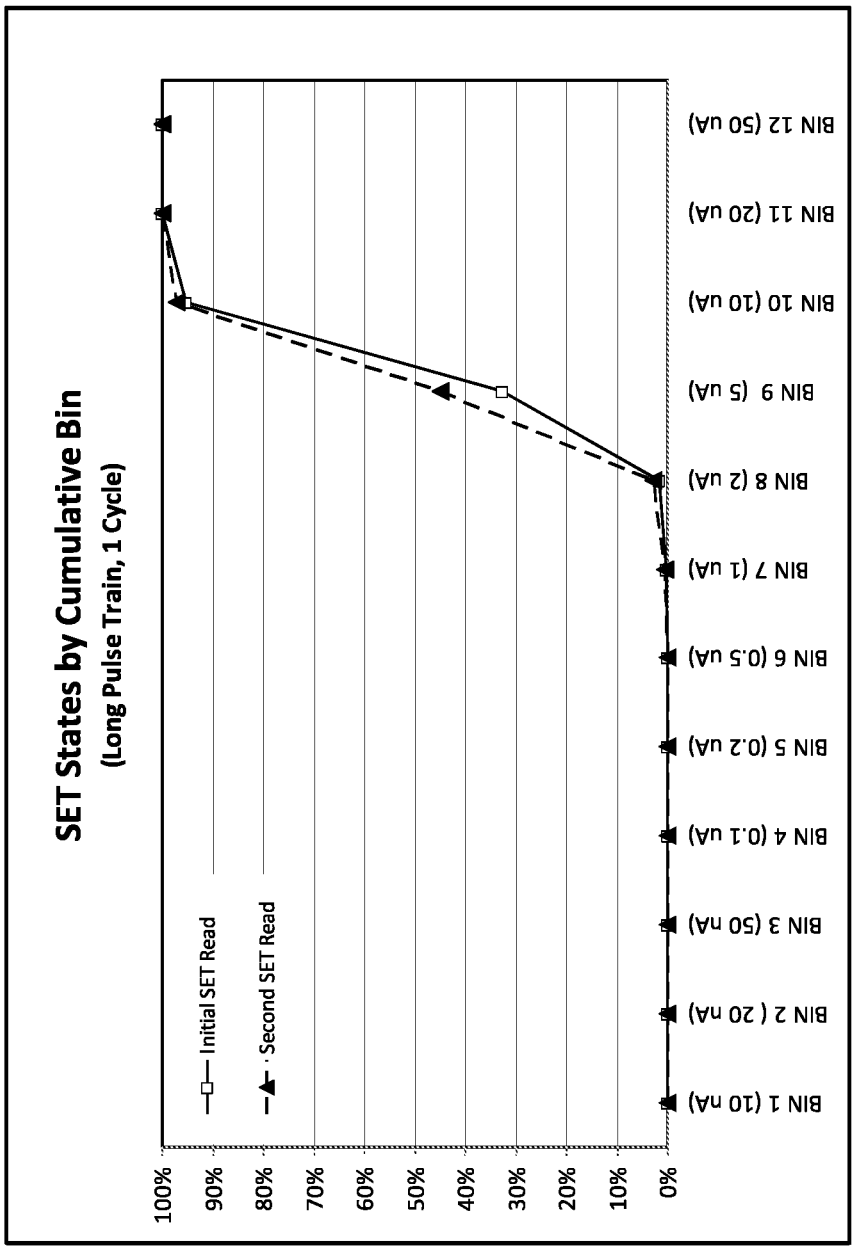

FIGS. 10A-10C plot the data recorded as the testing algorithm depicted in FIG. 6 was run on a subgroup #4 (1832 nanotube switching devices) using a 1.75V 5 MHz pulse train for 500 µs as the programming stimulus for each cycle. Within subgroup #4, each device was cycled (RESET and then SET) once. As can be seen in the plots of FIG. 10A-10C, this testing run—using a long train of subpulses—resulted in significantly less drift as compared with the test results from the single pulse programming runs (FIGS. 7A-7C, 8A-8C, and 9A-9C).

Figure 11A:
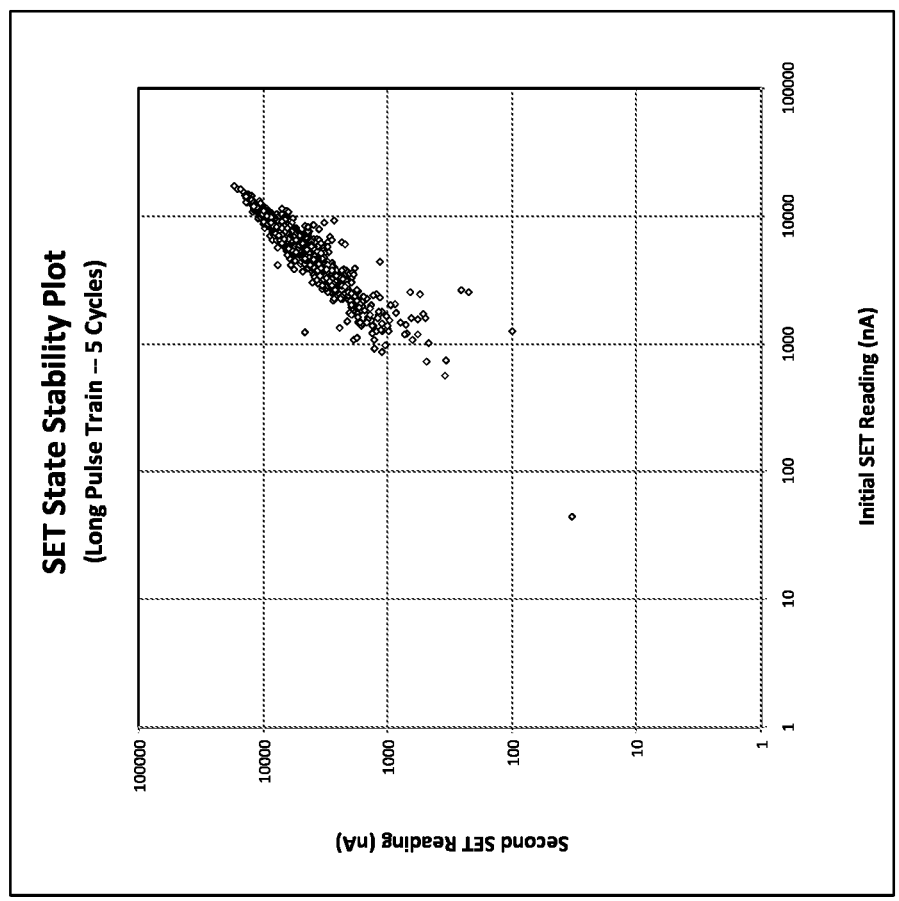
FIGS. 11A-11C are data plots depicting the stability of a resistive change cell array programmed through five cycles (using the procedure depicted in FIG. 6) via the application of a long pulse train.
Figure 11B:
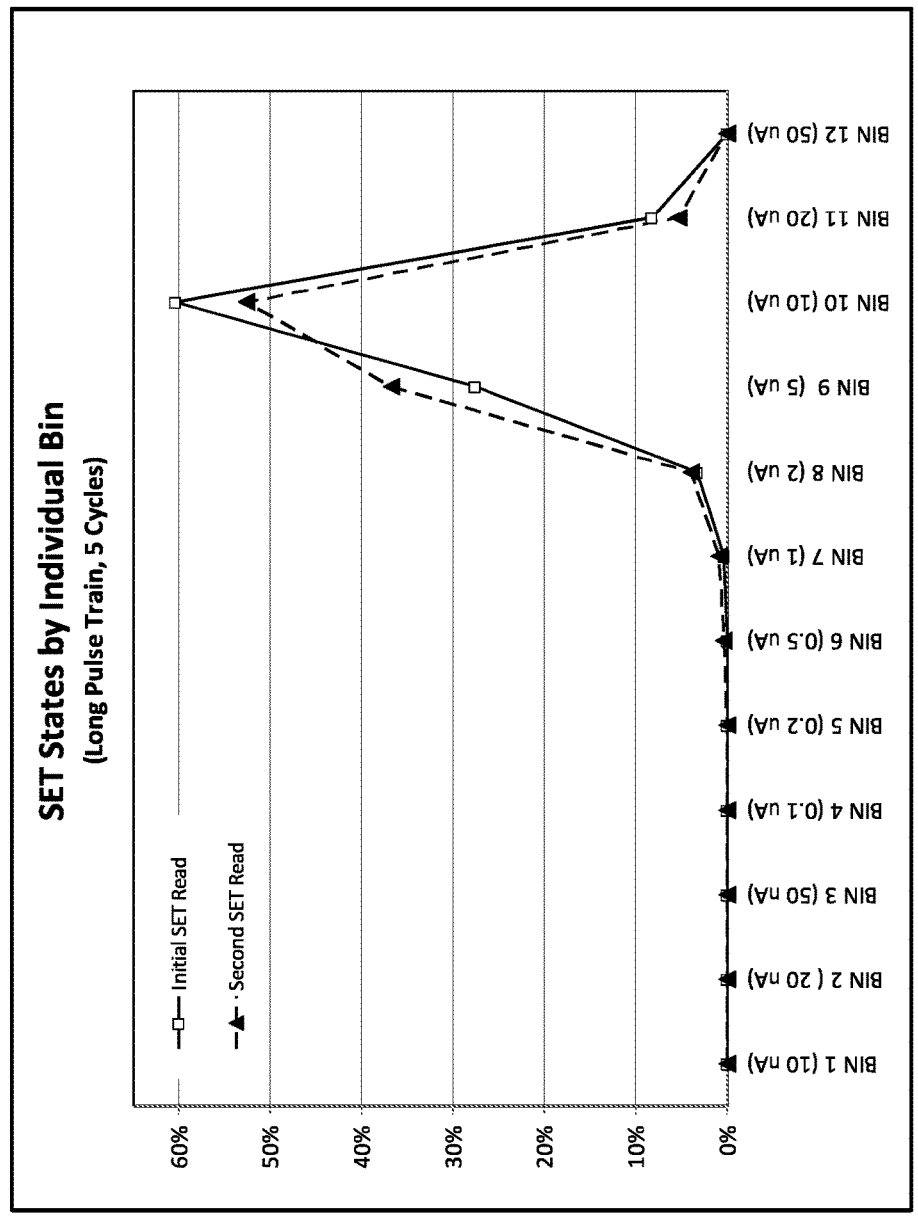
Figure 11C:
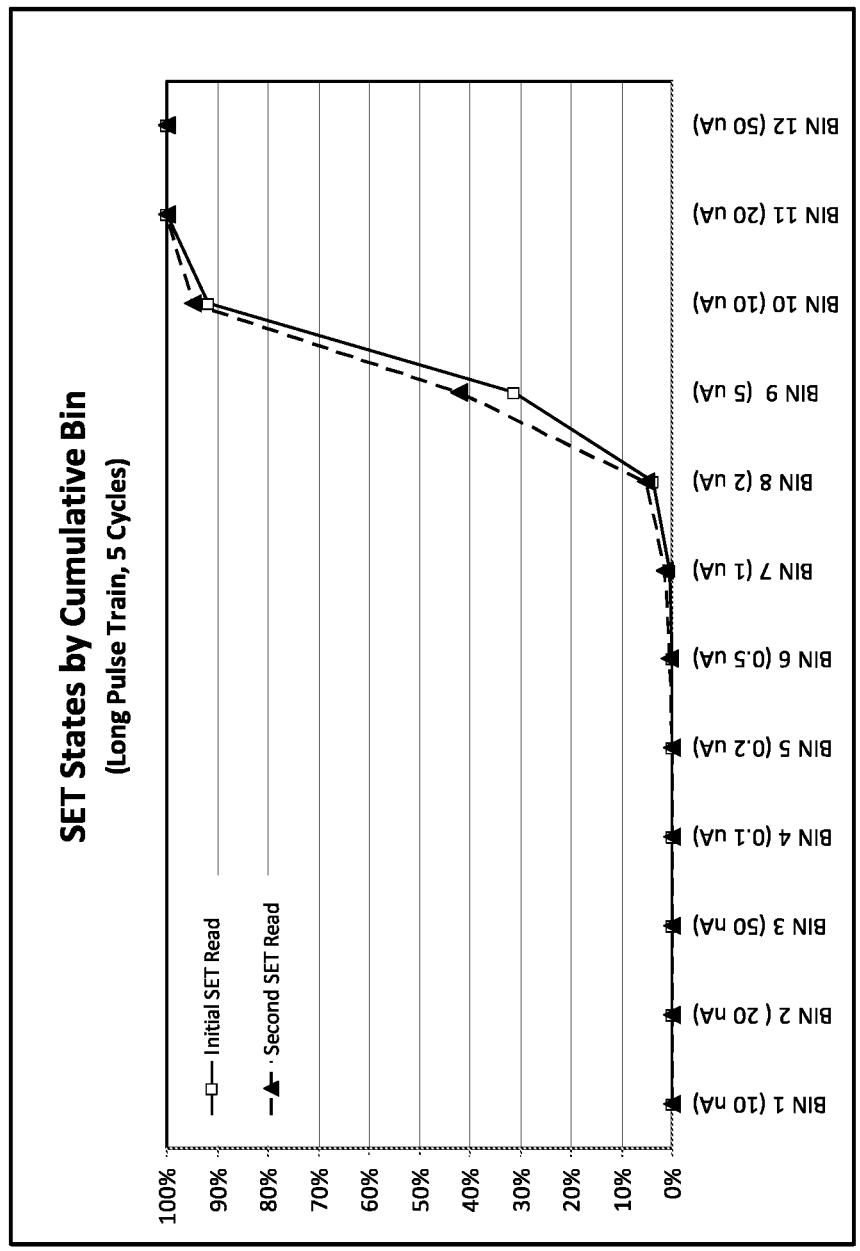

FIGS. 11A-11C plot the data recorded as the testing algorithm depicted in FIG. 6 was run on a subgroup #5 (1709 nanotube switching devices) using a 1.75V 5 MHz pulse train for 500 µs as the programming stimulus for each cycle. Within subgroup #5, each device was cycled (RESET and then SET) five times. As can be seen in the plots of FIG. 11A-11C, this testing run—using a long train of subpulses—resulted in significantly less drift as compared with the test results from the single pulse programming runs (FIGS. 7A-7C, 8A-8C, and 9A-9C).

Figure 12A:
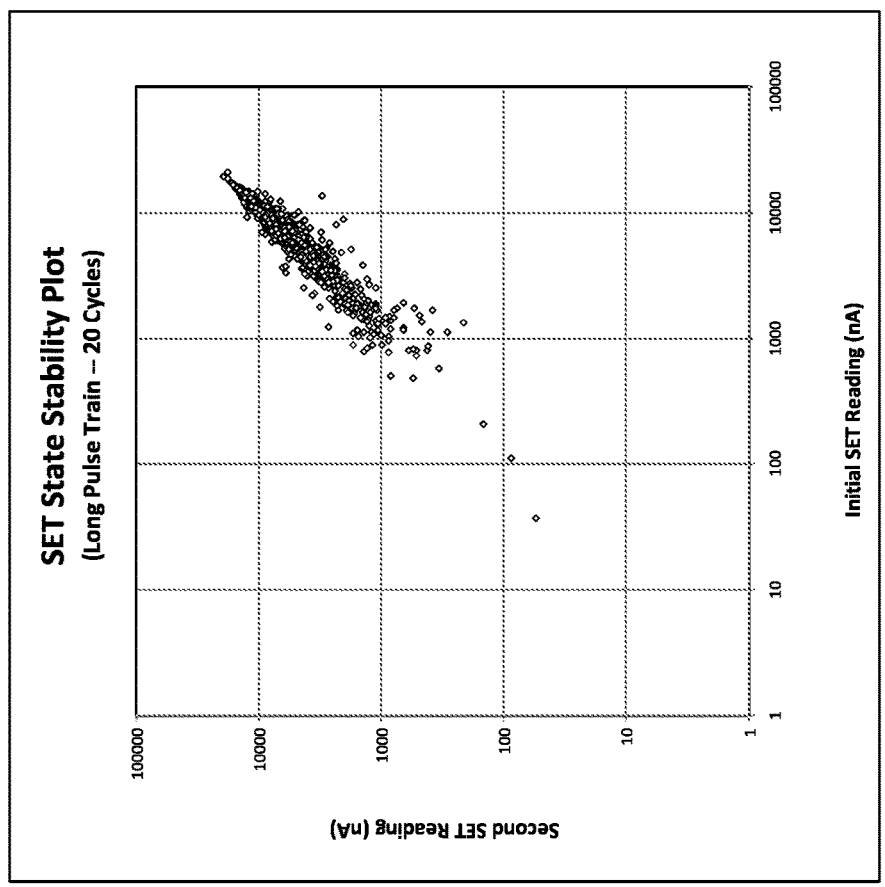
FIGS. 12A-12C are data plots depicting the stability of a resistive change cell array programmed through twenty cycles (using the procedure depicted in FIG. 6) via the application of a long pulse train.
Figure 12B:
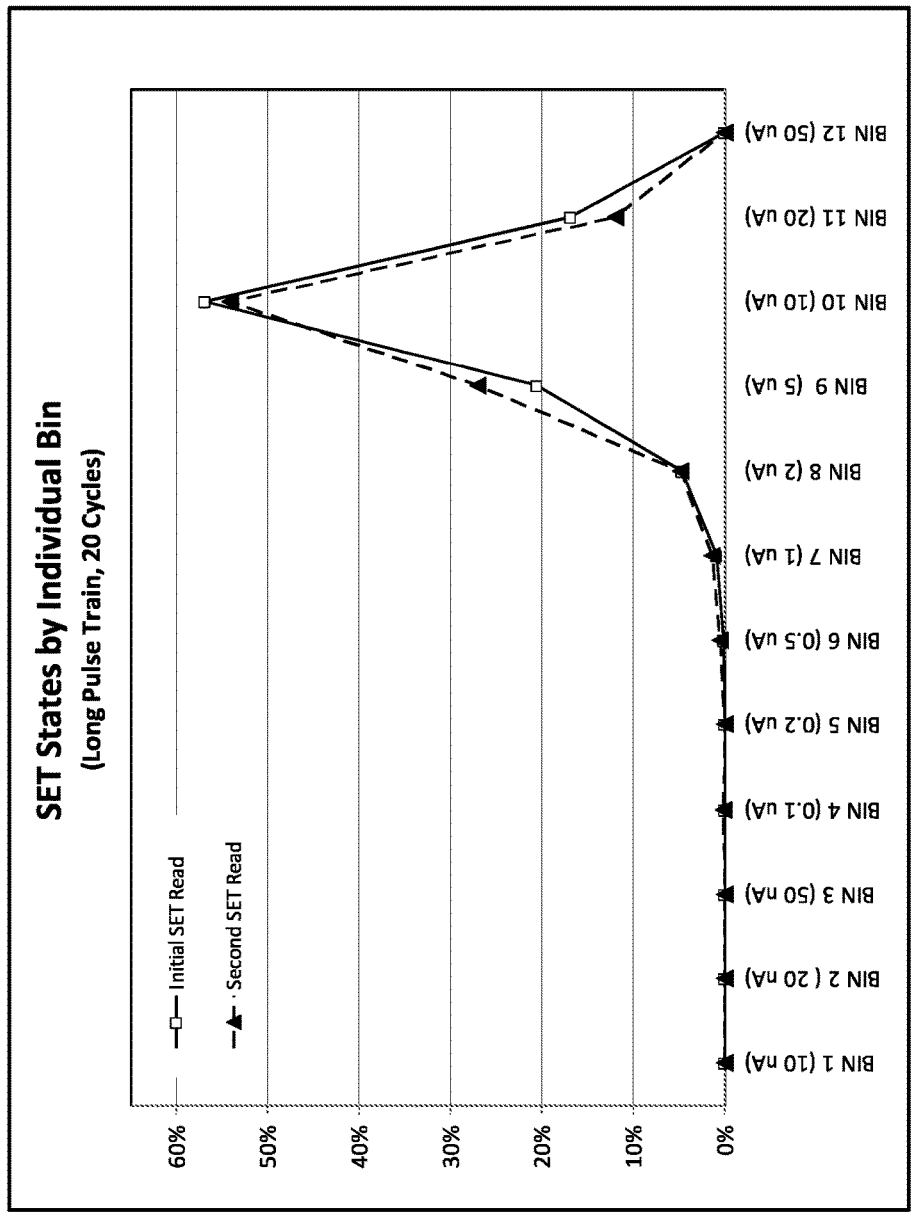
Figure 12C:
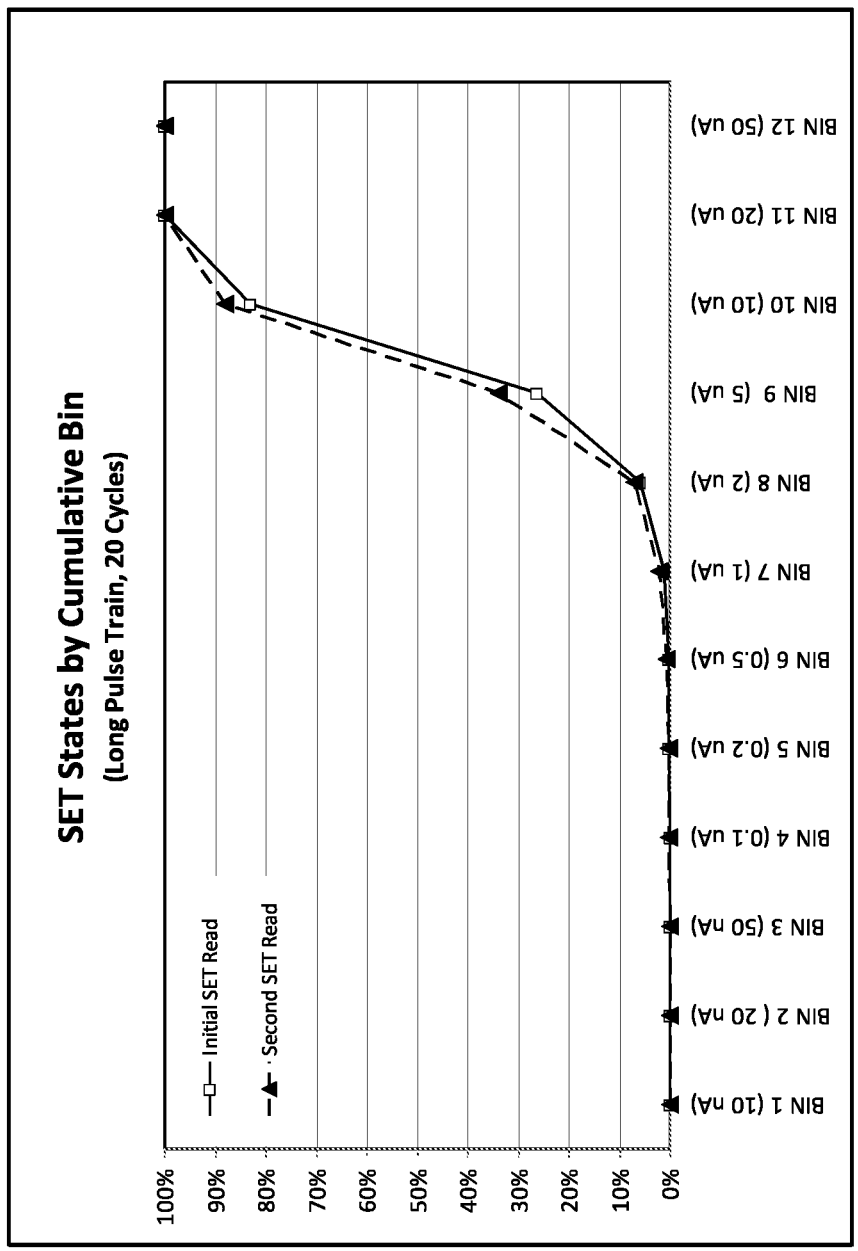

FIGS. 12A-12C plot the data recorded as the testing algorithm depicted in FIG. 6 was run on a subgroup #6 (1538 nanotube switching devices) using a 1.75V 5 MHz pulse train for 500 µs as the programming stimulus for each cycle. Within subgroup #6, each device was cycled (RESET and then SET) twenty times. As can be seen in the plots of FIG. 12A-12C, this testing run—using a long train of subpulses—resulted in significantly less drift as compared with the test results from the single pulse programming runs (FIGS. 7A-7C, 8A-8C, and 9A-9C).

Figure 13A:
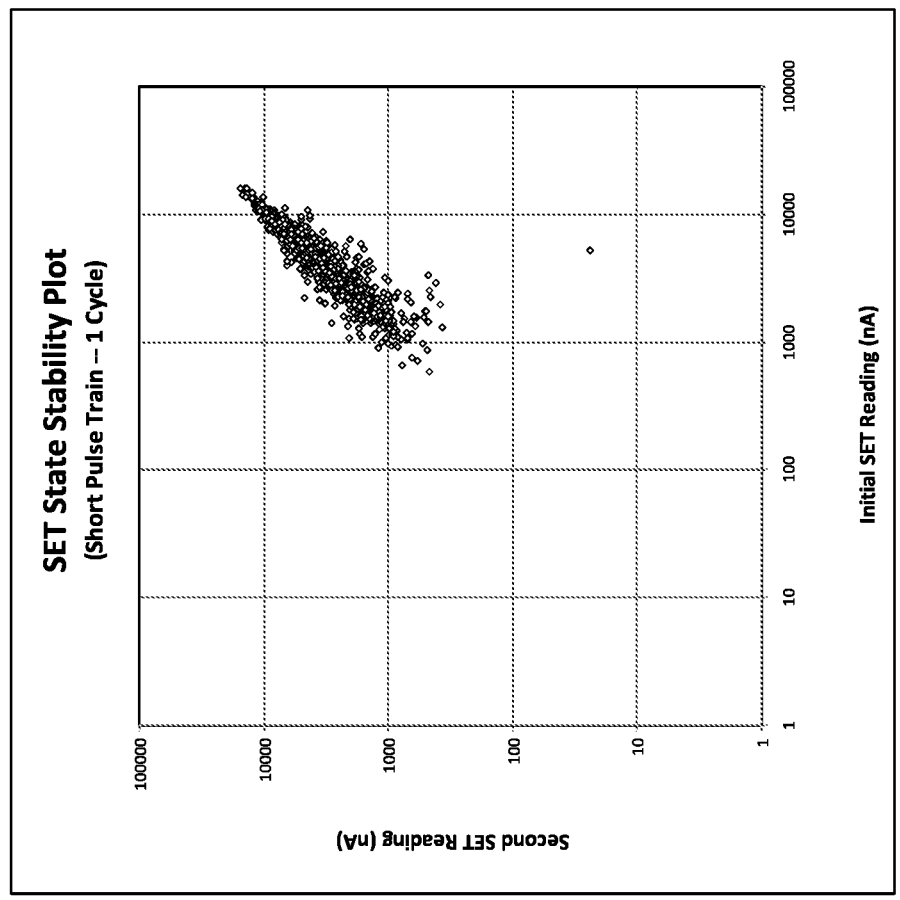
FIGS. 13A-13C are data plots depicting the stability of a resistive change cell array programmed over a single cycle (using the procedure depicted in FIG. 6) via the application of a short pulse train.
Figure 13B:
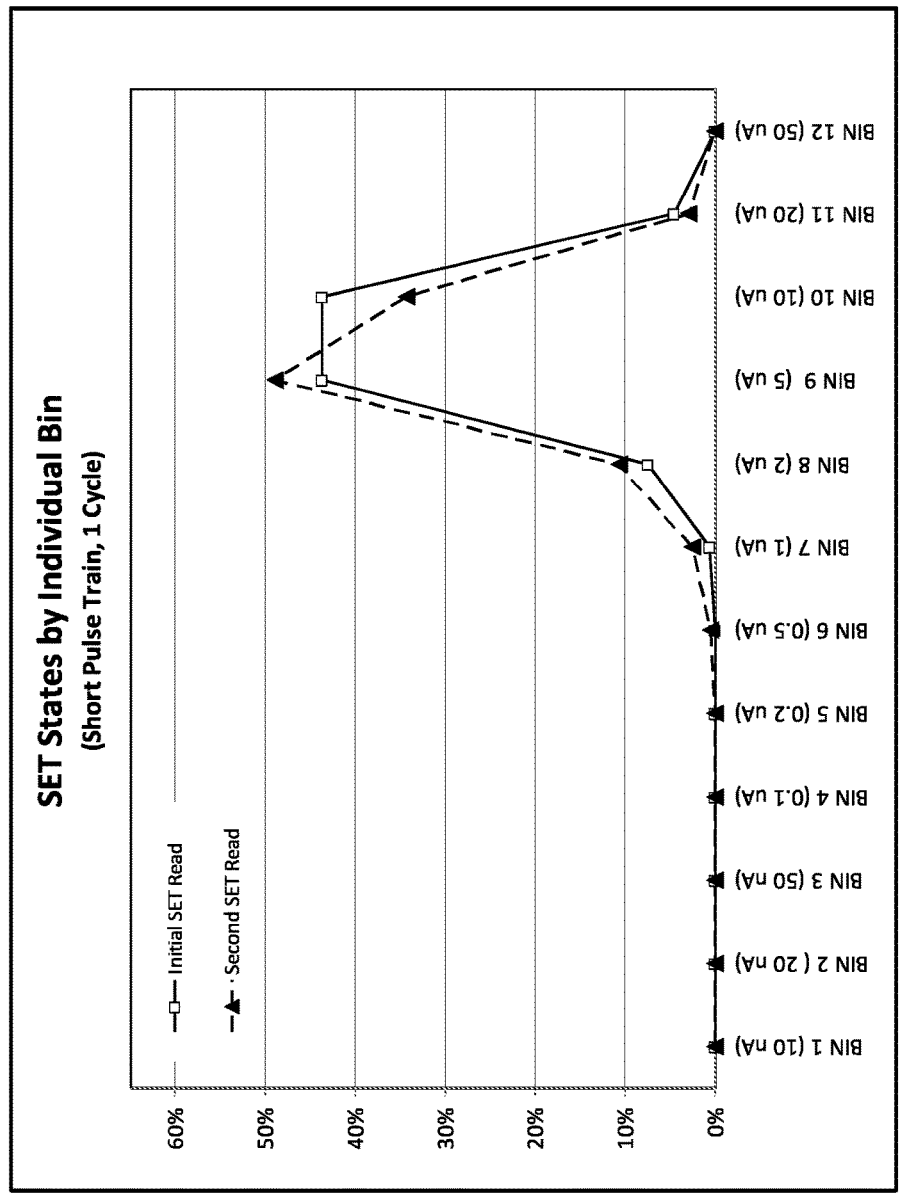
Figure 13C:
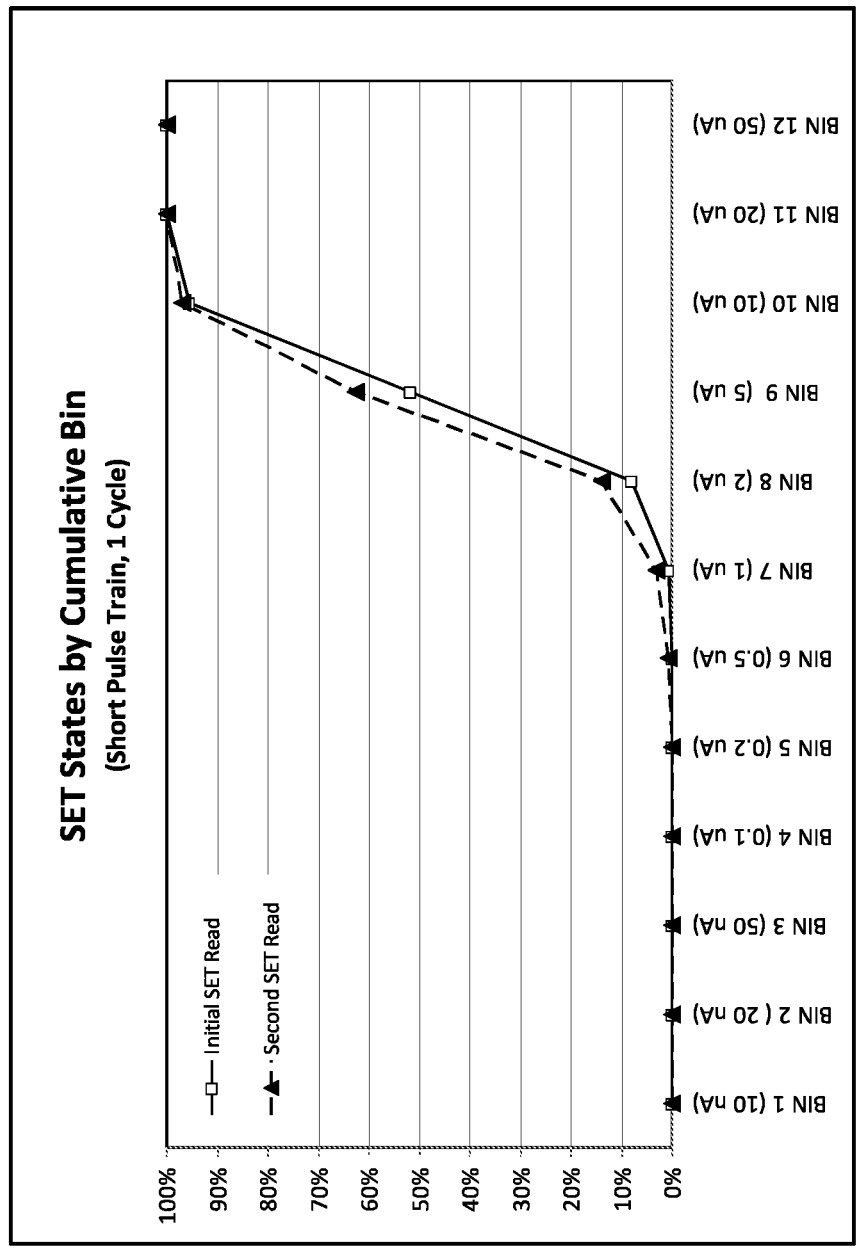

FIGS. 13A-13C plot the data recorded as the testing algorithm depicted in FIG. 6 was run on a subgroup #7 (1913 nanotube switching devices) using a 1.75V 5 MHz pulse train for 50 µs as the programming stimulus for each cycle. Within subgroup #7, each device was cycled (RESET and then SET) once. As can be seen in the plots of FIG. 13A-13C, this testing run—using a short train of subpulses—resulted in significantly less drift as compared with the test results from the single pulse programming runs (FIGS. 7A-7C, 8A-8C, and 9A-9C) but slightly more drift as compared with the test result from the long pulse train programming runs (FIGS. 10A-10C, 11A-11C, and 12A-12C).

Figure 14A:
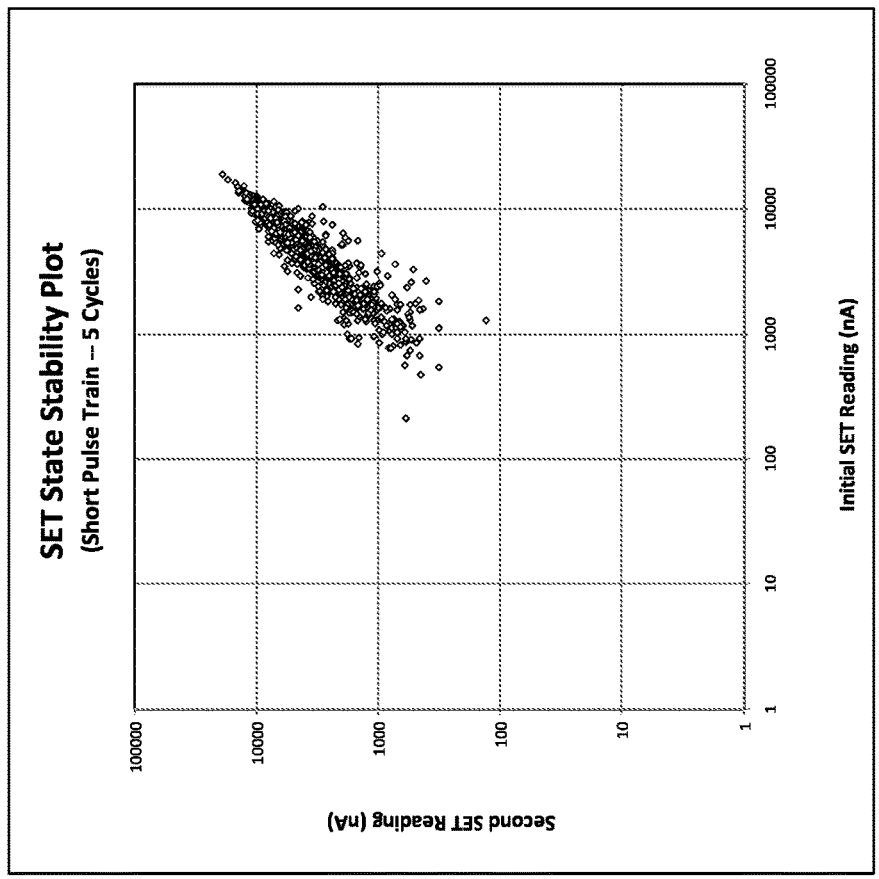
FIGS. 14A-14C are data plots depicting the stability of a resistive change cell array programmed through five cycles (using the procedure depicted in FIG. 6) via the application of a short pulse train.
Figure 14B:
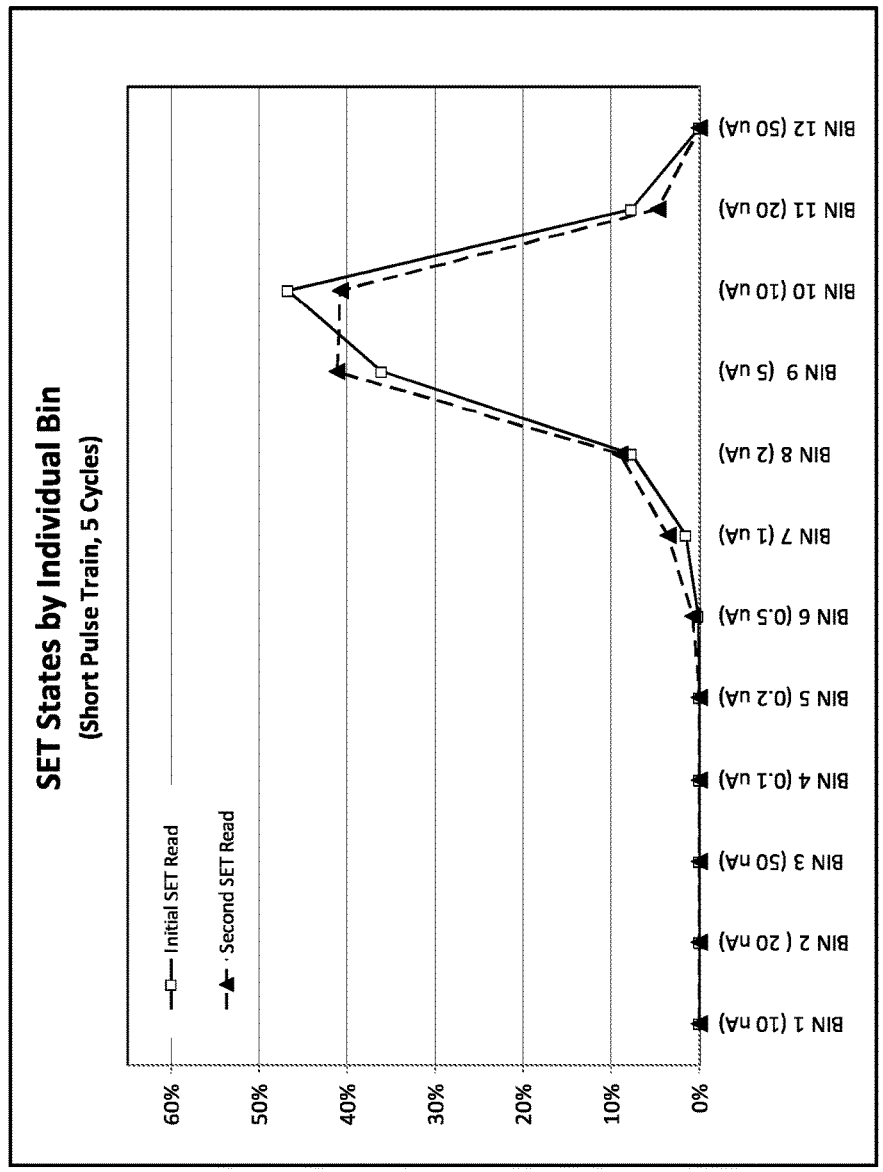
Figure 14C:
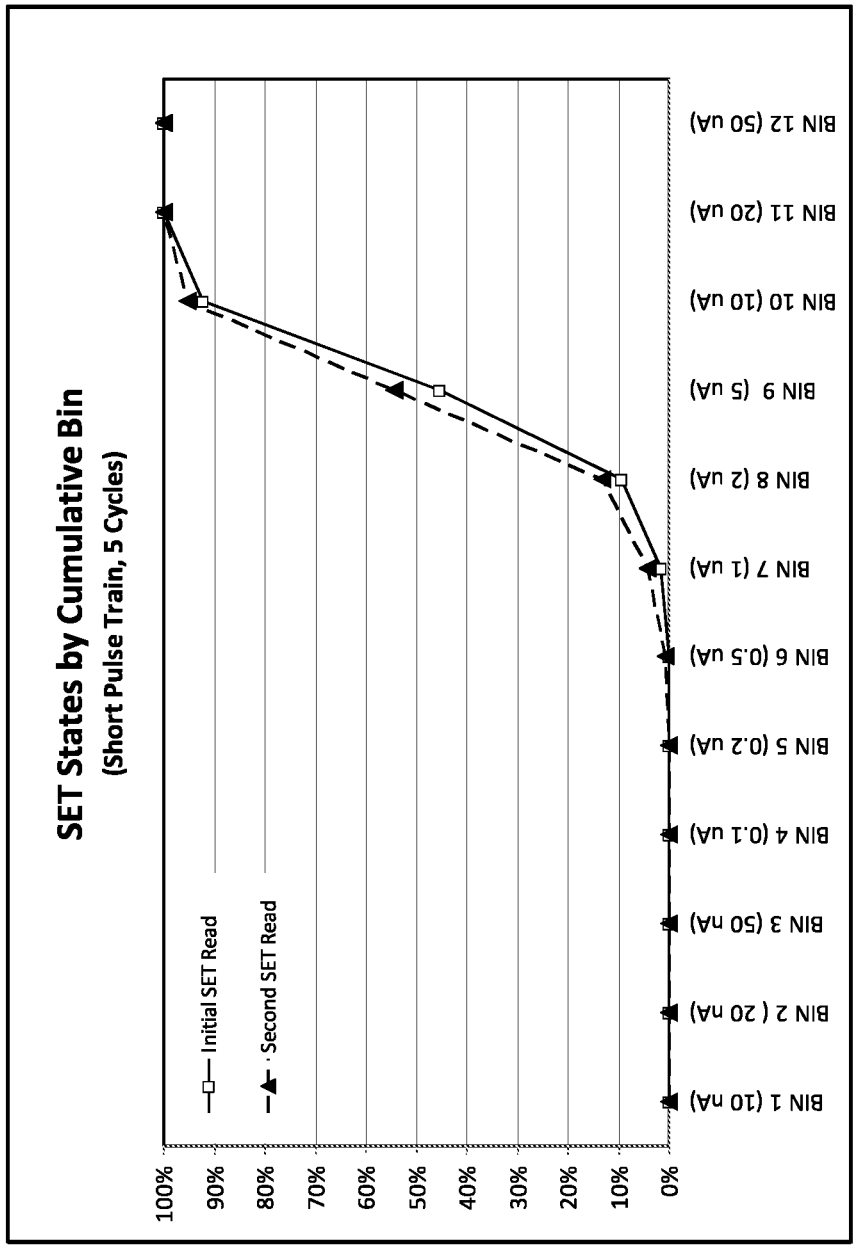

FIGS. 14A-14C plot the data recorded as the testing algorithm depicted in FIG. 6 was run on a subgroup #8 (1856 nanotube switching devices) using a 1.75V 5 MHz pulse train for 50 µs as the programming stimulus for each cycle. Within subgroup #8, each device was cycled (RESET and then SET) five times. As can be seen in the plots of FIG. 14A-14C, this testing run—using a short train of subpulses—resulted in significantly less drift as compared with the test results from the single pulse programming runs (FIGS. 7A-7C, 8A-8C, and 9A-9C) but slightly more drift as compared with the test result from the long pulse train programming runs (FIGS. 10A-10C, 11A-11C, and 12A-12C).

Figure 15A:
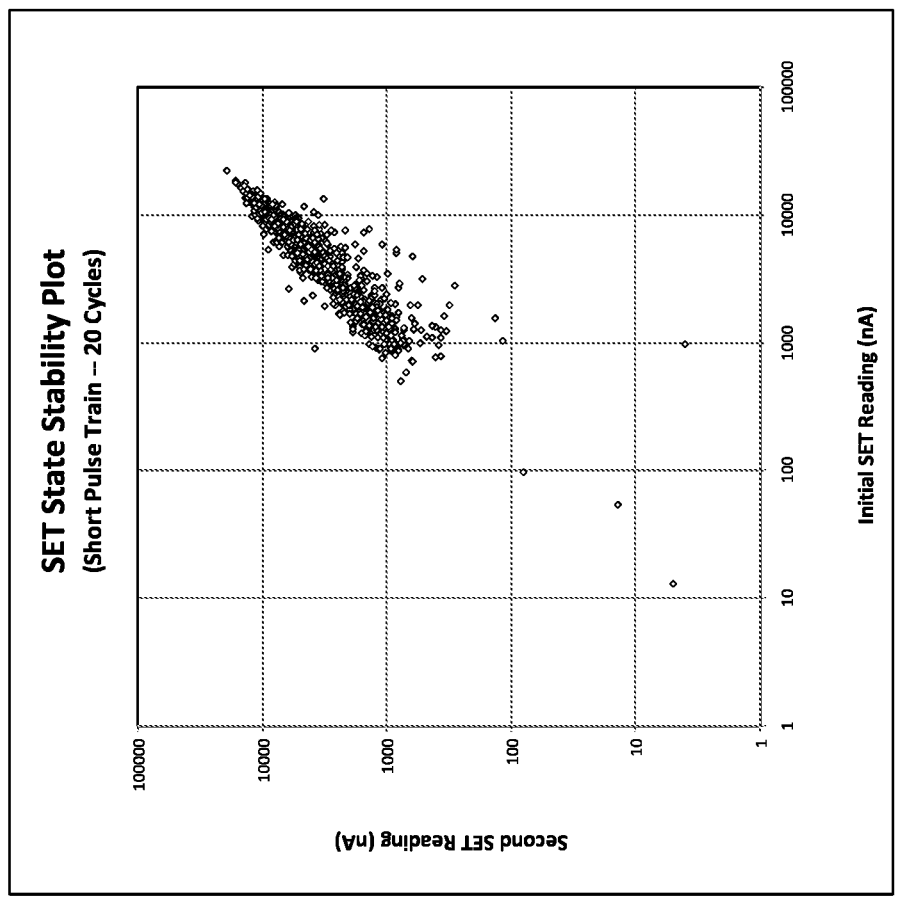
FIGS. 15A-15C are data plots depicting the stability of a resistive change cell array programmed through twenty cycles (using the procedure depicted in FIG. 6) via the application of a short pulse train.
Figure 15B:
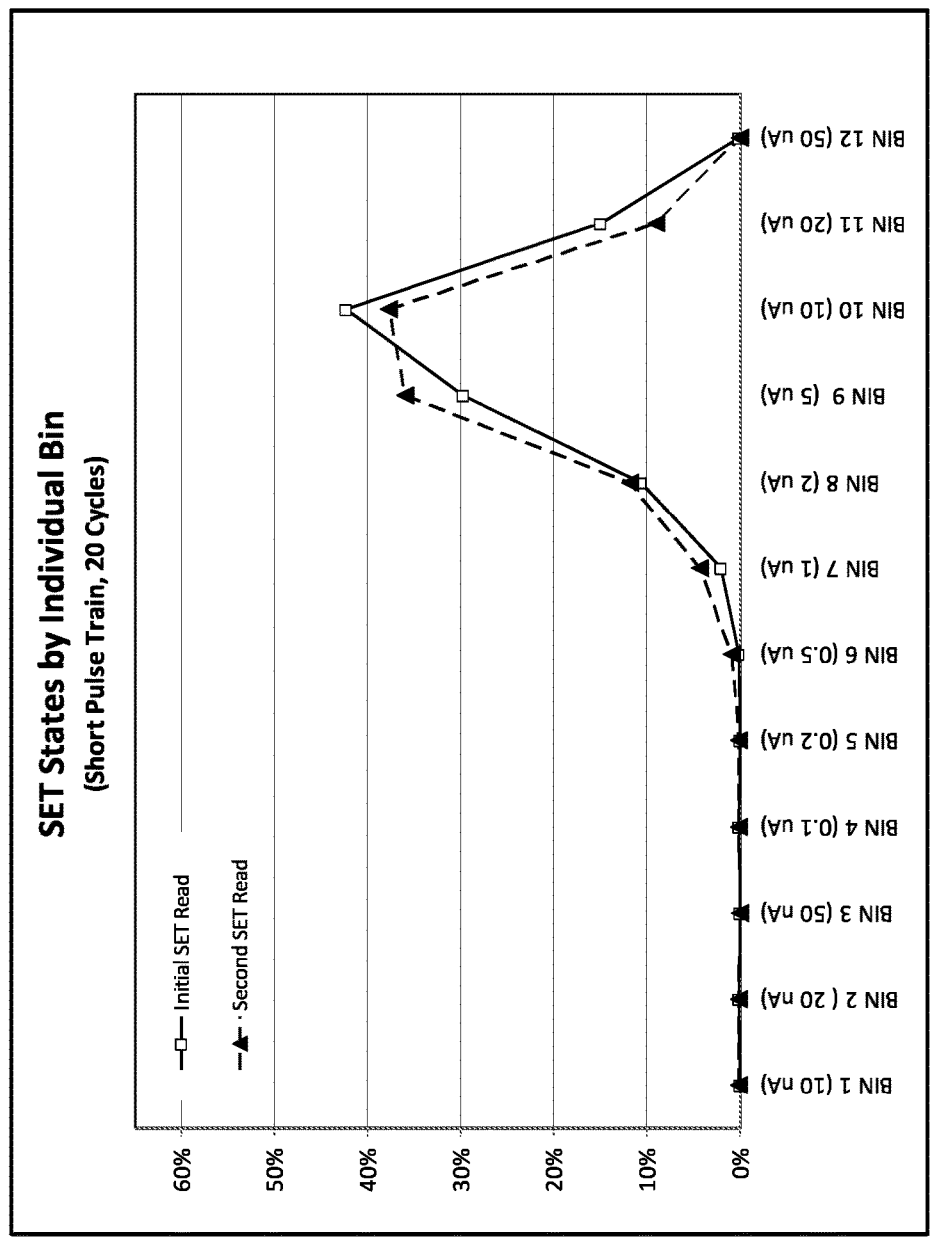
Figure 15C:
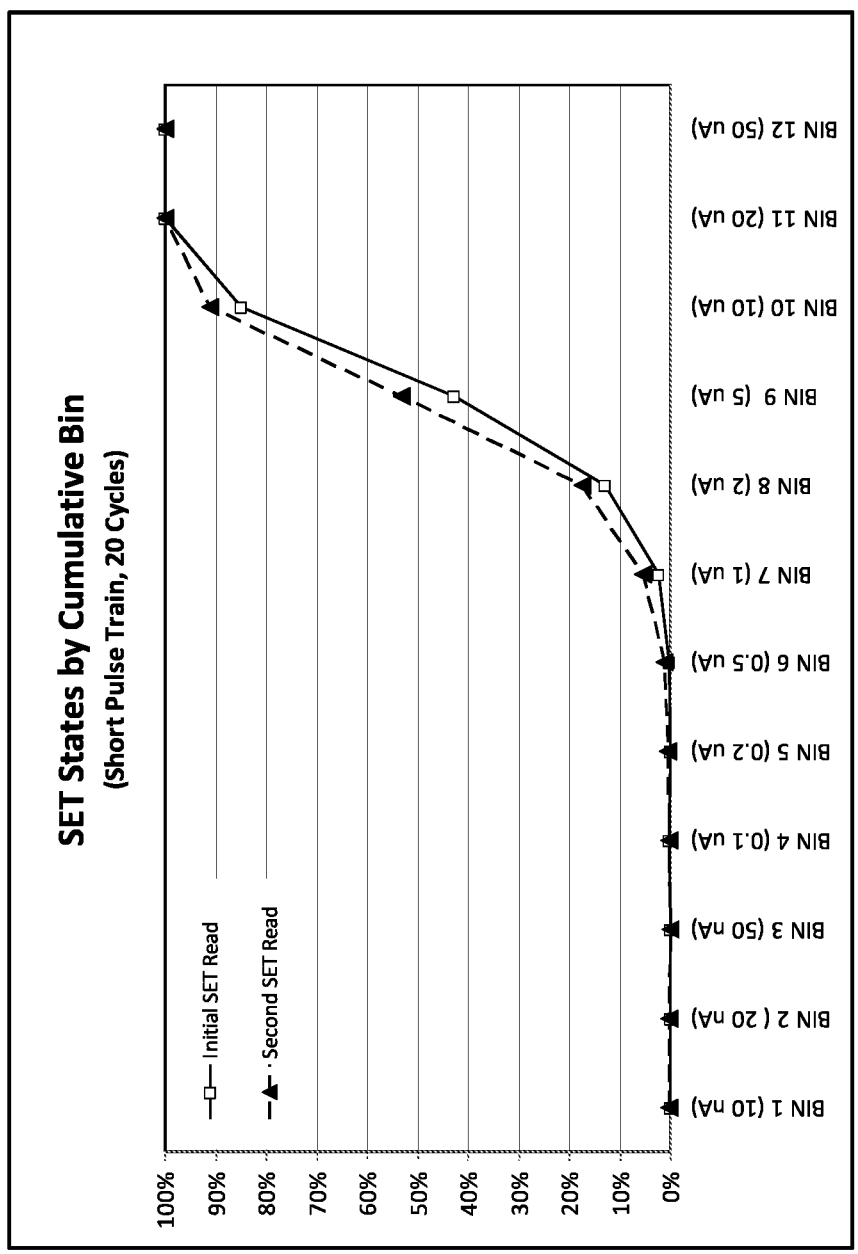

FIGS. 15A-15C plot the data recorded as the testing algorithm depicted in FIG. 6 was run on a subgroup #9 (1666 nanotube switching devices) using a 1.75V 5 MHz pulse train for 50 µs as the programming stimulus for each cycle. Within subgroup #9, each device was cycled (RESET and then SET) twenty times. As can be seen in the plots of FIG. 15A-15C, this testing run—using a short train of subpulses—resulted in significantly less drift as compared with the test results from the single pulse programming runs (FIGS. 7A-7C, 8A-8C, and 9A-9C) but slightly more drift as compared with the test result from the long pulse train programming runs (FIGS. 10A-10C, 11A-11C, and 12A-12C).

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of adjusting a resistance of a nanotube fabric layer formed from carbon nanotubes, said method comprising:
    applying a periodic electrical stimulus to said nanotube fabric layer for a fixed time;
    wherein said periodic electrical stimulus has a frequency and a duty cycle, and wherein said fixed time is selected such that said periodic electrical stimulus successively stimulates said nanotube fabric layer multiple times; and
    wherein said successive stimulation renders said nanotube fabric layer into a stable resistive state.

2. The method of claim 1 wherein said successive stimulation prevents said nanotube fabric layer from entering into a metastable state.

3. The method of claim 1 where said periodic electrical stimulus is a pulse train.

4. The method of claim 1 wherein said duty cycle is on the order of 20 percent.

5. The method of claim 1 wherein said duty cycle is on the order of 50 percent.

6. The method of claim 1 wherein said duty cycle is on the order of 80 percent.

7. The method of claim 1 wherein said frequency is on the order of 10 MHz.

8. The method of claim 1 wherein said nanotube fabric layer is adjusted from a high resistive state to a low resistive state.

9. The method of claim 1 wherein said nanotube fabric layer is adjusted from a low resistive state to a high resistive state.

10. The method of claim 1 wherein said nanotube fabric layer is adjusted from one predefined resistive range to one of at least two other predefined resistance ranges.

11. The method of claim 1 wherein said nanotube fabric layer is part of a resistive change memory cell.

12. The method of claim 1 wherein said nanotube fabric layer is part of a resistive change logic device.

13. The method of claim 1 wherein said nanotube fabric layer is part of a sensor element.

14. The method of claim 1 wherein said periodic electrical stimulus is a square wave.

* * * * *